(12) United States Patent
Yuan et al.

(10) Patent No.: US 12,041,828 B2
(45) Date of Patent: Jul. 16, 2024

(54) DISPLAY BASEPLATE AND MANUFACTURING METHOD THEREOF, AND DISPLAY DEVICE

(71) Applicants: Hefei BOE Joint Technology Co.,Ltd., Anhui (CN); BOE Technology Group Co., Ltd., Beijing (CN)

(72) Inventors: Can Yuan, Beijing (CN); Yongqian Li, Beijing (CN); Zhidong Yuan, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 477 days.

(21) Appl. No.: 17/416,523

(22) PCT Filed: Oct. 20, 2020

(86) PCT No.: PCT/CN2020/122238
§ 371 (c)(1),
(2) Date: Jun. 21, 2021

(87) PCT Pub. No.: WO2021/082989
PCT Pub. Date: May 6, 2021

(65) Prior Publication Data
US 2022/0085133 A1    Mar. 17, 2022

(30) Foreign Application Priority Data

Oct. 29, 2019 (CN) .......................... 201911038550.1

(51) Int. Cl.
*H10K 59/131* (2023.01)
*H10K 50/86* (2023.01)
(Continued)

(52) U.S. Cl.
CPC ......... *H10K 59/131* (2023.02); *H10K 50/865* (2023.02); *H10K 59/1213* (2023.02);
(Continued)

(58) Field of Classification Search
CPC . H10K 59/131; H10K 59/1213; G09G 3/3266
See application file for complete search history.

(56) References Cited

U.S. PATENT DOCUMENTS

| 8,817,217 B2 * | 8/2014 | Kwak | G02F 1/1345 |
| | | | 349/149 |
| 10,996,258 B2 * | 5/2021 | Chaji | G09G 3/006 |

(Continued)

*Primary Examiner* — Mamadou L Diallo
(74) *Attorney, Agent, or Firm* — Ling Wu; Stephen Yang; Ling and Yang Intellectual Property

(57) ABSTRACT

A display substrate, manufacturing method thereof, and display device. The display substrate comprises: a substrate, gate line, data line, power connection line and multiple sub-pixels on the substrate, the display substrate has defective points formed by short-circuiting of the gate line and data line, and the gate line forming defective points is a defective gate line; the data line forming defective points is a defective data line; the power connection line is arranged on the same layer as gate electrodes of multiple transistors; the defective gate line and defective power connection line are disconnected, the display substrate further comprises: a repair line disposed on one side, away from the substrate, of the source drain electrode of multiple transistors, the repair line is respectively connected to the partially disconnected defective gate line and partially disconnected defective power connection line, and is used for transmitting scanning signals to repair the display substrate.

20 Claims, 8 Drawing Sheets

(51) Int. Cl.
*H10K 59/12* (2023.01)
*H10K 59/121* (2023.01)
*H10K 59/35* (2023.01)

(52) U.S. Cl.
CPC ....... *H10K 59/1216* (2023.02); *H10K 59/353* (2023.02); *H10K 59/1201* (2023.02)

(56) References Cited

U.S. PATENT DOCUMENTS

| | | | | |
|---|---|---|---|---|
| 2007/0007520 | A1* | 1/2007 | Seo | H01L 27/124 257/E29.295 |
| 2012/0153310 | A1* | 6/2012 | Kwak | G02F 1/134363 257/E21.531 |
| 2020/0302840 | A1* | 9/2020 | Kim | G09G 3/006 |
| 2021/0020729 | A1* | 1/2021 | Kitakado | H10K 50/00 |
| 2021/0384481 | A1* | 12/2021 | Sun | H10K 59/1213 |
| 2022/0149079 | A1* | 5/2022 | Kang | H01L 25/0753 |

\* cited by examiner

DISPLAY BASEPLATE AND MANUFACTURING METHOD THEREOF, AND DISPLAY DEVICE

CROSS-REFERENCE TO RELATED APPLICATIONS

The present application is a U.S. National Phase Entry of International Application No. PCT/CN2020/122238 having an international filing date of Oct. 20, 2020, which claims priority to Chinese Patent Application No. 201911038550.1 entitled "Display Substrate and Manufacturing Method thereof, and Display Device" and filed to the CNIPA on Oct. 29, 2019. The above-identified applications are incorporated into this application by reference in their entirety.

TECHNICAL FIELD

Embodiments of the present disclosure relates to, but is not limited to, the field of display technology, and more particularly, to a display baseplate, a manufacturing method thereof, and a display device.

BACKGROUND

Organic light emitting diode (OLED) display baseplates have advantages such as ultra-thinness, large viewing angle, active light emitting, high brightness, continuous and adjustable emitting colors, low cost, fast response speed, low power consumption, wide operating temperature range and flexible display, and have gradually become an extremely promising next generation display technology. According to different driving modes, OLEDs may be classified into two types, a passive matrix (PM) type and an active matrix (AM) type, wherein an AMOLED is a current driving device in which an independent thin film transistor (TFT) is used for controlling each sub-pixel, and each sub-pixel may be continuously and independently driven to emit light.

A display area of an OLED display baseplate includes gate lines and data lines which are crossed horizontally and vertically. Generally, the gate lines are manufactured on the same layer as a gate electrode layer in the display area, and the data lines are manufactured on the same layer as a source and drain metal layer in the display area, so that there is a large overlap area between the gate lines and the data lines in the display area.

SUMMARY

A summary of the subject matter described in detail in the present disclosure will be provided below. The summary is not intended to limit the protection scope of the claims.

In a first aspect, an embodiment of the present disclosure provides a display baseplate including a substrate, gate lines, data lines, power connection lines and multiple sub-pixels which are defined by crossing of the gate lines and the data lines wherein the gate lines, the data lines and the power connection lines, and the multiple sub-pixels are arranged on the substrate, each sub-pixel includes a driving circuit; the driving circuit includes multiple transistors and a storage capacitor, there is a defective point formed by a short circuit of a gate line and a data line on the display baseplate, wherein a gate line forming a defective point is a defective gate line; a data line forming a defective point is a defective data line; the multiple transistors include a switch transistor, a driving transistor and a sensing transistor, a first electrode of the storage capacitor is connected to a second electrode of the switch transistor and a gate electrode of the driving transistor respectively, and a second electrode of the storage capacitor is connected to a second electrode of the driving transistor and a second electrode of the sensing transistor respectively.

For each sub-pixel, a first electrode of the driving transistor is connected to a power connection line; the power connecting line is arranged on a same layer as gate electrodes of the multiple transistors; the defective gate line is connected respectively to gate electrodes of switch transistors in a first repair sub-pixel and a second repair sub-pixel; wherein the first repair sub-pixel and the second repair sub-pixel are located at both sides of the defective data line respectively, and a power connection line connected to the first repair sub-pixel and the second repair sub-pixel is a defective power connection line; and the defective gate line is disconnected from the defective power connection line, and for the first repair sub-pixel and second repair sub-pixel, the display baseplate further includes a repair line arranged at one side of source and drain electrodes of the multiple transistors away from the substrate, wherein the repair line is connected respectively to a partially disconnected defective gate line and a partially disconnected defective power connection line and is used for transmitting scanning signals to repair the display baseplate.

In an exemplary embodiment, the defective gate line includes a first scanning portion, a second scanning portion and a third scanning portion which are arranged along an extending direction of the gate lines and disconnected from each other, wherein the second scanning portion is located between the first scanning portion and the third scanning portion; there is an overlap area between an orthogonal projection of the second scanning portion on the substrate and an orthogonal projection of the defective data line on the substrate, and the first scanning portion is connected to a gate electrode of a switch transistor in a sub-pixel located at one side of the defective data line close to the first repair sub-pixel; the third scanning portion is connected to a gate electrode of a switch transistor in a sub-pixel located at one side of the defective data line close to the second repair sub-pixel; and the repair line is connected to the first scanning portion and the third scanning portion respectively.

In an exemplary embodiment, the defective power connection line includes a first connection portion, a second connection portion and a third connection portion which are arranged along the extending direction of the gate lines and are disconnected from each other; wherein the second connection portion is located between the first connection portion and the third connection portion; and there is an overlap area between an orthogonal projection of the first connection portion on the substrate and a first electrode of a driving transistor in the first repair sub-pixel, and the first connection portion is connected to the first electrode of the driving transistor in the first repair sub-pixel; there is an overlap area between an orthogonal projection of the third connection portion on the substrate and a first electrode of a driving transistor in the second repair sub-pixel, and the third connection portion is connected to the first electrode of the driving transistor in the second repair sub-pixel; there is an overlap area between an orthogonal projection of the second connection portion on the substrate and second electrodes of switch transistors in the first repair sub-pixel and the second repair sub-pixel, and the second connection portion is connected to the repair line.

In an exemplary embodiment, the repair line includes a first repair portion and a second repair portion; and the first repair portion is connected to the first scanning portion and the second connection portion respectively; and the second repair portion is connected to the third scanning portion and the second connection portion respectively.

In an exemplary embodiment, a manufacturing material of the first repair portion and the second repair portion includes tungsten.

In an exemplary embodiment, each of the first repair sub-pixel and the second repair sub-pixel includes a first groove and a second groove; wherein the first groove penetrates through an active layer of a switch transistor in a sub-pixel where the first groove is located, and an orthogonal projection of the first groove on the substrate is located between an orthogonal projection of a first electrode of a switch transistor in a sub-pixel where the first groove is located, on the substrate, and an orthogonal projection of a gate electrode of the switch transistor in the sub-pixel where the first groove is located, on the substrate; and the second groove penetrates through a second electrode of a switch transistor in a sub-pixel where the second groove is located, and an orthogonal projection of the second groove on the substrate is located between an orthogonal projection of the power connection line on the substrate and an orthogonal projection of a gate electrode of a driving transistor in a sub-pixel where the second groove is located, on the substrate.

In an exemplary embodiment, each of the first repair sub-pixel and the second repair sub-pixel further includes a first via hole and a second via hole; wherein the first via hole in the first repair sub-pixel is used for exposing the first scanning portion, the first via hole in the second repair sub-pixel is used for exposing the third scanning portion, and the second via hole is used for exposing the second connection portion.

In an exemplary embodiment, the first repair portion is connected to the first scanning portion through the first via hole in the first repair sub-pixel, and the first repair portion is connected to the second connection portion through the second via hole in the first repair sub-pixel; the second repair portion is connected to the third scanning portion through the first via hole in the second repair sub-pixel; and the second repair portion is connected to the second connection portion through the second via hole in the second repair sub-pixel.

In an exemplary embodiment, the storage capacitor is a transparent capacitor, a first electrode of the storage capacitor is arranged on a same layer as active layers of the multiple transistors, and a second electrode of the storage capacitor is arranged at one side of source and drain electrodes of the multiple transistors away from the substrate; and a manufacturing material of the second electrode is a transparent conductive material, and a manufacturing material of the first electrode is the same as that of the active layers of the multiple transistors.

In an exemplary embodiment, each sub-pixel includes a storage capacitor region provided with the storage capacitor and a non-storage capacitor region provided with the multiple transistors; the non-storage capacitor region includes a first non-storage capacitor region and a second non-storage capacitor region; the first non-storage capacitor region and the second non-storage capacitor region are located at both sides of the storage capacitor region respectively, the switch transistor and the driving transistor are located in the first non-storage capacitor region, and the sensing transistor is located in the second non-storage capacitor region.

In an exemplary embodiment, for each sub-pixel in an ith row, the gate electrode of the switch transistor is connected to a gate line in an ith row, and the gate electrode of the sensing transistor is connected to a gate line in an (i+1)th row, the gate line in the ith row and the gate line in an (i+1)th row are located at both sides of a storage capacitor region of sub-pixels in the ith row respectively.

In an exemplary embodiment, the display baseplate further includes power lines, sensing lines and data lines which are arranged in a same layer as the source and drain electrodes of the multiple transistors; for each sub-pixel, the first electrode of the driving transistor is connected to a power line through a power connection line, and the first electrode of the sensing transistor is connected to a sensing line; each pixel includes four sub-pixels, each pixel is connected to four columns of data lines one column of power line, and two columns of sensing lines, respectively, each sub-pixel corresponds to one column of data line and each pixel corresponds to one column of power line and two columns of sensing lines; the four sub-pixels are arranged along the extending direction of the gate lines in sequence, and a power line corresponding to each pixel is arranged between a second sub-pixel and a third sub-pixel, a power line in a first column is arranged at one side of a first sub-pixel away from the second sub-pixel, and a power line in a second column is arranged at one side of a fourth sub-pixel away from the third sub-pixel; and a data line corresponding to the first sub-pixel is located at one side of the first sub-pixel close to the second sub-pixel; a data line corresponding to the second sub-pixel is located at one side of the second sub-pixel close to the first sub-pixel, a data line corresponding to the third sub-pixel is located at one side of the third sub-pixel close to the fourth sub-pixel; and a data line corresponding to the fourth sub-pixel is located at one side of the fourth sub-pixel close to the third sub-pixel.

In an exemplary embodiment, the display baseplate further includes a buffer layer and a light shielding layer disposed at one side of the active layers of the multiple transistors close to the substrate; and sensing connection lines connected to the sensing lines; the light shielding layer is disposed at one side of the buffer layer close to the substrate, the sensing connection lines are arranged on a same layer as the light shielding layer, and an orthogonal projection of the light shielding layer on the substrate covers that of an active area of an active layer of the driving transistor on the substrate; and for each sub-pixel, the first electrode of the sensing transistor is connected to the sensing lines through the sensing connection lines.

In an exemplary embodiment, the display baseplate further includes a gate insulating layer disposed between the active layers of the multiple transistors and the gate electrodes of the multiple transistors and an interlayer insulating layer disposed between the active layers of the multiple transistors and the source and drain electrodes of the multiple transistors; an orthographic projection of the gate insulating layer on the substrate coincides with an orthographic projection of the gate electrodes of the multiple transistors on the substrate, and the first via hole is provided on the interlayer insulating layer.

In a second aspect, an embodiment of the present disclosure further provides a display device including the display baseplate described above.

In a third aspect, an embodiment of the present disclosure further provides a method for manufacturing the display baseplate described above, which includes:

forming on a substrate, gate lines, data lines, power connection lines, and multiple sub-pixels defined by crossing of the gate lines and the data lines, wherein each sub-pixel includes a driving circuit; the driving circuit includes multiple transistors and a storage capacitor; the multiple transistors include a switch transistor, a driving transistor and a sensing transistor, a first electrode of the storage capacitor is connected to a second electrode of the switch transistor and a gate electrode of the driving transistor respectively, and a second electrode of the storage capacitor is connected to a second electrode of the driving transistor and a second electrode of the sensing transistor respectively; for each sub-pixel, a first electrode of the driving transistor is connected to a power connection line; the power connecting line is arranged on a same layer as gate electrodes of the multiple transistors;

searching for a defective point formed by a short circuit of a gate line and a data line, wherein a gate line forming a defective point is a defective gate line, a data line forming a defective point is a defective data line, a first repair sub-pixel and a second repair sub-pixel are located at both sides of the defective data line respectively, and are connected to the defective data line, and a power connection line connected to the first repair sub-pixel and the second repair sub-pixel is a defective power connection line; and disconnecting the defective gate line from the defective power connection line, and forming a repair line in the first repair sub-pixel and second repair sub-pixel to repair the display baseplate, wherein the repair line is arranged at one side of source and drain electrodes of the multiple transistors away from the substrate, the repair line is connected respectively to a partially disconnected defective gate line and a partially disconnected defective power connection line and is used for transmitting scanning signals to repair the display baseplate.

In an exemplary embodiment, forming, on the substrate, the gate lines, the data lines, the power connection lines, and the multiple sub-pixels defined by the crossing of the gate lines and the data lines includes:

forming a light shielding layer and sensing connection lines on the substrate;

forming a buffer layer on the light shielding layer and the sensing connection lines;

forming active layers of the multiple transistors and the first electrode of the storage capacitor on the buffer layer;

forming a gate insulating layer on the active layers of the multiple transistors and the first electrode of the storage capacitor;

forming the gate lines, the gate electrodes of the multiple transistors and the power connection lines on the gate insulating layer;

forming an interlayer insulating layer on the gate lines, the gate electrodes of the multiple transistors and the power connection lines; and forming the data lines, power lines, sensing lines and the source and drain electrodes of the multiple transistors on the interlayer insulating layer.

In an exemplary embodiment, disconnecting the defective gate line from the defective power connection line includes:

cutting the defective gate line into a first scanning portion, a second scanning portion and a third scanning portion disconnected from each other, along an arrangement direction of the gate lines using a laser process, wherein there is an overlap area between an orthogonal projection of the second scanning portion on the substrate and an orthogonal projection of the defective data line on the substrate, and the first scanning portion is connected to a gate electrode of a switch transistor in a sub-pixel located at one side of the defective data line close to the first repair sub-pixel; the third scanning portion is connected to a gate electrode of a switch transistor in a sub-pixel located at one side of the defective data line close to the second repair sub-pixel;

cutting the defective power connection line into a first connection portion, a second connection portion and a third connection portion disconnected from each other, along the arrangement direction of the gate lines using the laser process, wherein there is an overlap area between an orthogonal projection of the first connection portion on the substrate and the first electrode of the driving transistor in the first repair sub-pixel, and the first connection portion is connected to the first electrode of the driving transistor in the first repair sub-pixel; there is an overlap area between an orthogonal projection of the third connection portion on the substrate and the first electrode of the driving transistor in the second repair sub-pixel, and the third connection portion is connected to the first electrode of the driving transistor in the second repair sub-pixel; there is an overlap area between an orthogonal projection of the second connection portion on the substrate and the second electrode of the switch transistor in the first repair sub-pixel and the second repair sub-pixel, and the second connection portion is connected to the repair line;

forming a first groove, a second groove, a first via hole and a second via hole in each of the first repair sub-pixel and the second repair sub-pixel using the laser process, wherein the first groove penetrates through the active layer of the switch transistor in the sub-pixel where the first groove is located, and an orthogonal projection of the first groove on the substrate is located between an orthogonal projection of the first electrode of the switch transistor in the sub-pixel where the first groove is located, on the substrate, and an orthogonal projection of the gate electrode of the switch transistor in the sub-pixel where the first groove is located, on the substrate; and the second groove penetrates through the second electrode of the switch transistor in the sub-pixel where the second groove is located, and an orthogonal projection of the second groove on the substrate is located between an orthogonal projection of the power connection line on the substrate and an orthogonal projection of the gate electrode of the driving transistor in the sub-pixel where the second groove is located, on the substrate; wherein the first via hole in the first repair sub-pixel is used for exposing the first scanning portion, the first via hole in the second repair sub-pixel is used for exposing the third scanning portion, and the second via hole is used for exposing the second connection portion.

In an exemplary embodiment, forming the repair line in the first repair sub-pixel and the second repair sub-pixel to repair the display baseplate includes:

depositing a metal film on the first sub-pixel and the second sub-pixel; and forming a first repair portion in the first sub-pixel and a second repair portion in the second sub-pixel through a patterning process to form the repair line;

wherein the first repair portion is connected to the first repair portion through the first via hole in the first repair sub-pixel, and the first repair portion is connected to the second connection portion through the second via hole in the first repair sub-pixel; the second repair portion is connected to the third scanning portion through the first via hole in the second repair sub-pixel, and the second repair portion is connected to the second connection portion through the second via hole in the second repair sub-pixel.

In an exemplary embodiment, the method further includes forming the second electrode of the storage capacitor on the data lines, the power lines, the sensing lines and the source and drain electrodes of the multiple transistors.

Other features and advantages of the present disclosure will be set forth in the following specification, and will become apparent partially from the specification, or be understood by implementing the present disclosure. Other advantages of the present disclosure may be implemented and obtained by schemes described in the specification, claims and drawings.

Other aspects may become apparent upon reading and understanding the accompanying drawings and the detailed description.

BRIEF DESCRIPTION OF DRAWINGS

The accompanying drawings are intended to provide a further understanding of technical schemes of the present disclosure and form a portion of the specification, and are intended to explain the technical schemes of the present disclosure together with embodiments of the present application and not constitute a limitation to the technical schemes of the present disclosure.

DETAILED DESCRIPTION

Figure 1:
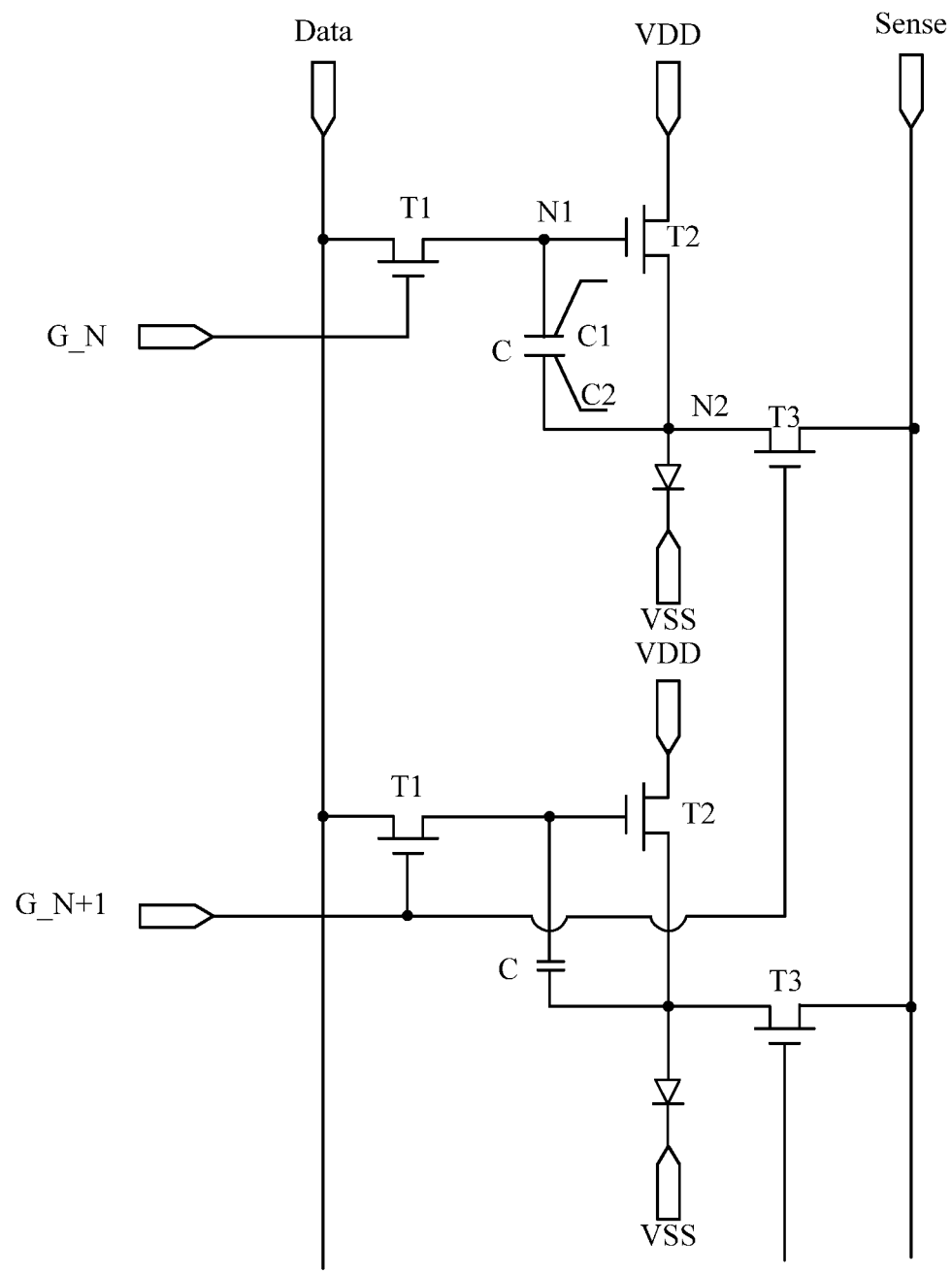
FIG. 1 is an equivalent circuit diagram of an OLED pixel driving circuit.

Multiple embodiments are described in the present disclosure, but the description is exemplary and not restrictive, and it is apparent to those of ordinary skills in the art that there may be more embodiments and implementation schemes within the scope of the embodiments described in the present disclosure. Although many possible combinations of features are shown in the drawings and discussed in the detailed description, many other combinations of the disclosed features are also possible. Unless specifically limited, any feature or element of any embodiment may be used in combination with or in place of any other feature or element of any other embodiment.

Combinations of features and elements known to those of ordinary skilled in the art are included and contemplated in the present disclosure. The disclosed embodiments, features and elements of the present disclosure may be combined with any conventional features or elements to form a unique scheme defined by the claims. Any feature or element of any embodiment may also be combined with features or elements from other schemes to form another unique scheme defined by the claims. Therefore, it should be understood that any of the features shown and/or discussed in the present disclosure may be implemented individually or in any suitable combination. Thus, there is no other limitations to the embodiments except limitations made according to the appended claims and equivalents thereof. In addition, various modifications and changes may be made within the protection scope of the appended claims.

In addition, when a representative embodiment is described, a method and/or a process may have been presented as a specific sequence of steps in the specification. However, to the extent that the method or process does not depend on the specific order of steps described herein, the method or process should not be limited to the specific order of steps described. As understood by those of ordinary skills in the art, other orders of steps are also possible. Therefore, the specific order of steps set forth in the specification should not be interpreted as limitation to the claims. In addition, the claims for the method and/or process should not be limited to the steps performed in the written order, and those of skilled in the art may readily understand that these orders may vary and still remain within the spirit and scope of the embodiments of the present disclosure.

Unless otherwise defined, technical terms or scientific terms used in the embodiments of the present disclosure shall have common meanings as understood by those of ordinary skills in the art to which the present disclosure pertains. The words "first", "second" and the like used in the embodiments of the present disclosure do not represent any order, quantity or importance, but are merely used to distinguish among different components. The words "include", "contain" or the like mean that elements or articles appearing before the words cover elements or articles listed after the words and their equivalents, without excluding other elements or articles. The words "connect", "link" or the like are not limited to physical or mechanical connection, but may include electrical connection, whether direct or indirect. "Up", "down", "left", "right" and the like are only used to represent a relative position relationship, which may change accordingly when an absolute position of an object being described is changed.

As described above, when there is a relatively large overlap area between gate lines and data lines in the display area, since a distance between a gate electrode layer and a source and drain metal layer is shorter, which causes a distance between the gate lines and the data lines is shorter, an insulating layer located in the overlap area of the gate lines and the data lines is easily broken down under action of capacitance caused by various reasons in sub-pixels, such that due to data gate short (DGS) caused by electrostatic discharge when driving is performed to display, there is a defective point formed by a short circuit of a gate line and a data line on an organic light-emitting diode (OLED) display baseplate, so transverse or longitudinal stripes are generated on the OLED display baseplate, further resulting in poor display effect of the OLED display baseplate.

In the present embodiment, the OLED display baseplate includes multiple sub-pixels, and each sub-pixel includes an OLED pixel driving circuit and an OLED. FIG. 1 is an equivalent circuit diagram of an OLED pixel driving circuit, illustrating a 3T1C driving circuit. As shown in FIG. 1, the OLED display baseplate includes multiple sub-pixels, wherein each sub-pixel includes a driving circuit and an organic light-emitting diode (OLED), and the pixel driving circuit is electrically connected to a gate line G_N, a sensing line Sense, a power line VDD, a data line Data and a gate line G_N+1, and includes a switch transistor T1, a driving transistor T2, a sensing transistor T3 and a storage capacitor C.

The display baseplate includes multiple rows of gate lines and multiple columns of data lines, wherein the gate line G_N is a gate line in an nth row and the gate line G_N+1 is a gate line in the (N+1)th row. A connection relationship is explained in FIG. 1 by taking OLED pixel driving circuits in two sub-pixels arranged along the column direction as an example.

A gate electrode of the switch transistor T1 in each OLED pixel driving circuit is connected to the gate line G_N, a first electrode of the switch transistor T1 is connected to the data line Data, a second electrode of the switch transistor T1 is connected to a node N1, a gate electrode of the driving transistor T2 is connected to the node N1, a first electrode of the driving transistor T2 is connected to the power line VDD, and a second electrode of the driving transistor T2 is connected to a node N2, a gate electrode of the sensing transistor T3 is connected to the gate line G_N+1, a first electrode of the sensing transistor T3 is connected to the sensing line Sense, a second electrode of the sensing transistor T3 is connected to a node N2, an anode of the OLED is connected to the node N2, a cathode of the OLED is connected to a low voltage line VSS, and the OLED is configured to emit light with corresponding brightness in response to a current in the second electrode of the driving transistor. The sensing transistor T3 can respond to a compensation sequence and extract a threshold voltage Vth and mobility of the driving transistor T2 to sense the threshold voltage Vth, and the storage capacitor C is used for maintaining a voltage difference between the node N1 and the node N2 in a light emitting period of one frame. That is, a gate electrode of a switch transistor in each row is connected to a gate electrode of a sensing transistor in the previous row.

Figure 2:
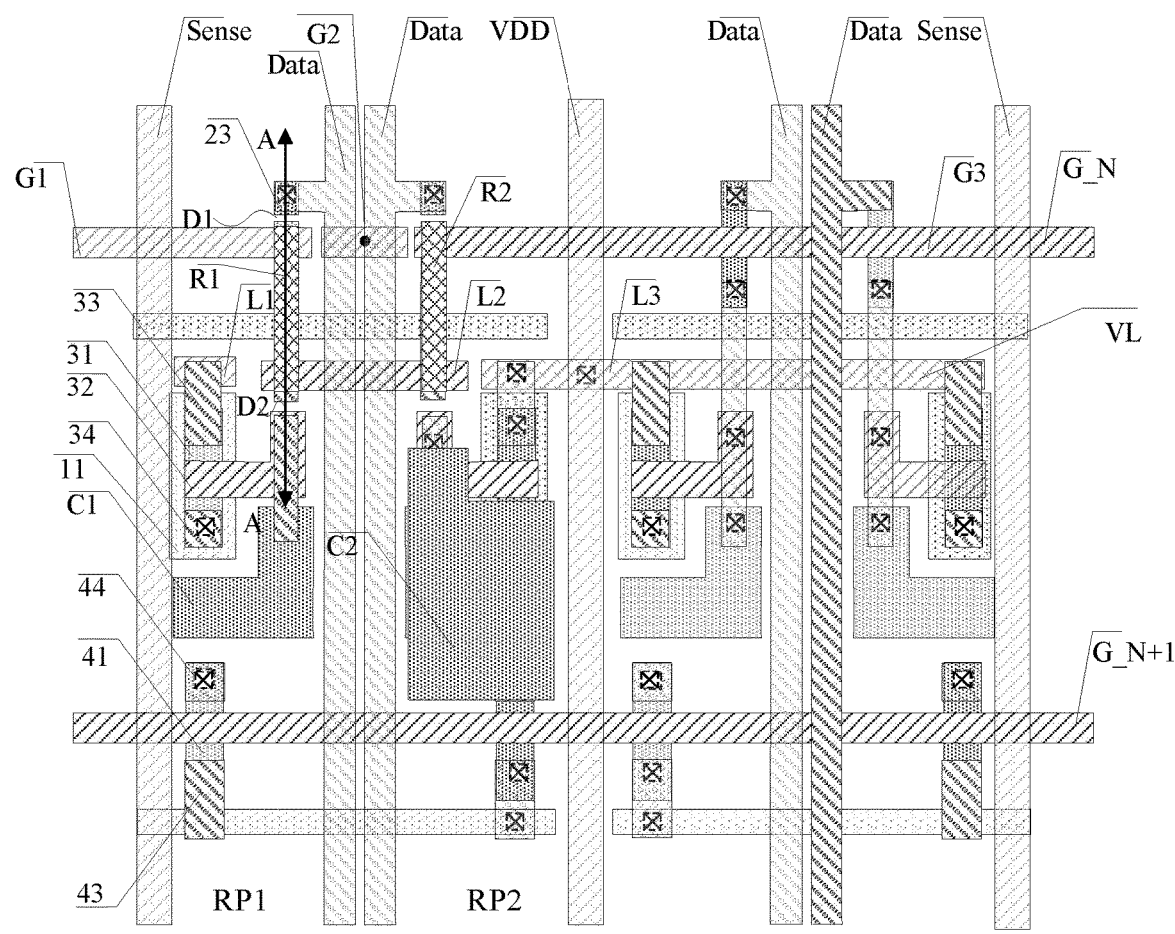
FIG. 2 is a schematic diagram of a structure of a display baseplate according to an embodiment of the present disclosure.
Figure 3:
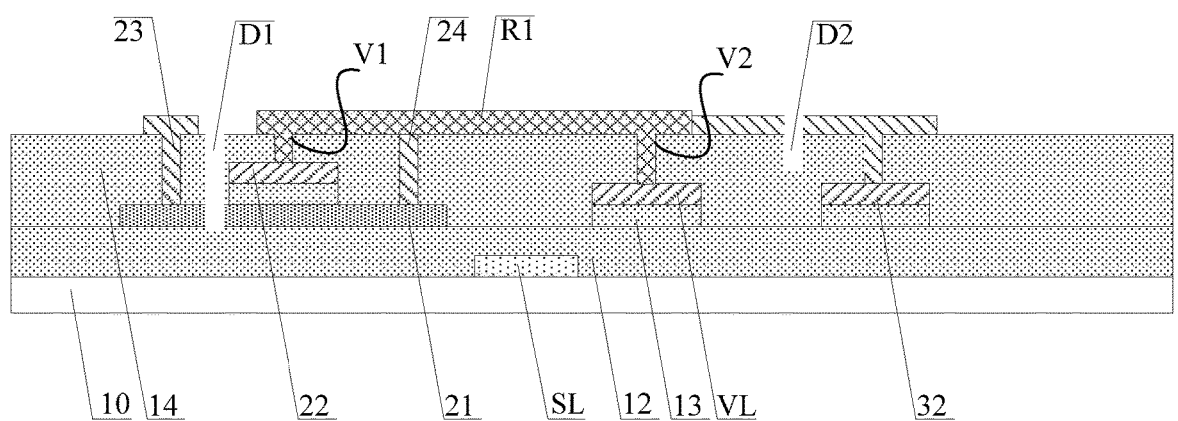
FIG. 3 is a sectional view taken along an A-A direction in FIG. 2.

An embodiment of the present disclosure provides a display baseplate. FIG. 2 is a schematic diagram of a structure of the display baseplate according to the embodiment of the present disclosure, and FIG. 3 is a sectional view along an A-A direction in FIG. 2. As shown in FIGS. 2 and 3, the display baseplate according to the embodiment of the present disclosure includes a substrate 10, gate lines G, data lines Data, a power connection line VL and multiple sub-pixels defined by crossing of the gate lines and the data lines, arranged on the substrate 10, each sub-pixel includes a driving circuit; the driving circuit includes multiple transistors and a storage capacitor, the multiple transistors includes a switch transistor, a driving transistor and a sensing transistor, and the storage capacitor is a transparent capacitor; there is a defective point (black point in FIG. 2) formed by a short circuit of a gate line and a data line on the display baseplate, wherein a gate line forming a defective point is a defective gate line, and a data line forming the defective point is a defective data line. The display baseplate further includes a repair line, and a first sub-pixel P1 and a second sub-pixel P2 located on both sides of the defective point and arranged along an extending direction of the gate lines. FIG. 2 is illustrated by taking a sub-pixel in the N-th row as an example.

For each sub-pixel, the first electrode of the driving transistor is connected to the power connection line VL; the power connecting line VL is arranged on the same layer as gate electrodes of the multiple transistors; the defective gate line G_N is connected respectively to gate electrodes of switch transistors in a first repair sub-pixel and a second repair sub-pixel; wherein the first repair sub-pixel and the second repair sub-pixel are located at both sides of the defective data line respectively, and are connected to the defective gate line, and a power connection line connected to the first repair sub-pixel and the second repair sub-pixel is a defective power connection line.

In the present embodiment, the defective gate line is disconnected from the defective power connection line, and for the first repair sub-pixel RP1 and the second repair sub-pixel RP2, the display baseplate further includes a repair line arranged at one side of source and drain electrodes of the multiple transistors away from the substrate, wherein the repair line is connected respectively to the partially disconnected defective gate line and the partially disconnected defective power connection line and is used for transmitting scanning signals to repair the display baseplate.

In an exemplary embodiment, the display baseplate may be a large-sized bottom-emitting OLED display baseplate, wherein data signals are provided by the data lines and scanning signals are provided by the gate lines.

FIG. 2 is illustrated by taking a display baseplate in which there is a defective point as an example. The gate line G_N in the figure is the defective gate line in the present disclosure, and other unshown gate lines are normal gate lines, that is, are not disconnected.

As shown in FIGS. 2 and 3, the display baseplate according to an embodiment of the present disclosure further includes an active layer 21, a gate electrode 22, a first electrode 23 and a second electrode 24 of the switch transistor, a light shielding layer 11, an active layer 31, a gate electrode 32, a first electrode 33 and a second electrode 34 of the driving transistor, an active layer 41, a gate electrode (not shown in the figure), a first electrode 43 and a second electrode 44 of the sensing transistor, a buffer layer 12, a gate insulting layer 13, an interlayer insulting layer 14, a first electrode C1 and a second electrode C2 of the storage capacitor C, the sensing line Sense and a compensation connection line SL.

The first electrode C1 of the storage capacitor is connected to the first electrode 24 of the switch transistor and the gate electrode 32 of the driving transistor respectively, and the second electrode C2 of the storage capacitor is connected to the second electrode 34 of the driving transistor and the second electrode 44 of the sensing transistor respectively.

The sensing line Sense is arranged on the same layer as the data line Data, and the compensation connection line SL is arranged on the same layer as the light shielding layer 11.

In an exemplary embodiment, there is an overlap area between an orthogonal projection of the light shielding layer 11 on the substrate and the gate electrode of the driving transistor, an orthogonal projection of the gate insulating layer on the substrate coincides with an orthogonal projection of the gate electrodes of the multiple transistors on the substrate, and a first via hole is disposed on the interlayer insulating layer.

Optionally, the substrate 10 may be a rigid substrate or a flexible substrate, wherein the rigid substrate may be, but is not limited to, one or more of glass and metal foils; and the flexible substrate may be, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers.

Optionally, the light shielding layer 11 and the sensing connection line SL are made of a metal, such as silver, aluminum or the like, and the embodiments of the present disclosure are not limited thereto.

It may be understood that a function of the buffer layer 12 on the substrate 10 is to prevent metal ions of the substrate from diffusing to the active layer, and reduce defects and decrease generation of leakage currents. The buffer layer may be made of silicon oxide (SiOx), silicon nitride (SiNx), silicon oxynitride (SiON), etc., or high dielectric materials such as aluminum oxide (AlOx), hafnium oxide (HfOx), tantalum oxide (TaOx), etc., and may be a single layer, multiple layers, or a composite layer.

Optionally, the active layer is made of metal oxide, for example, indium gallium zinc oxide (IGZO), and the embodiments of the present disclosure are not limited thereto.

Optionally, the first electrode C1 and the second electrode C2 may be made of a transparent conductive material, and the embodiments of the present disclosure are not limited thereto.

Optionally, the buffer layer 12, the gate insulating layer 13, and the interlayer insulating layer 14 may be made of oxide, nitride or oxynitride, and the embodiments of the present disclosure are not limited thereto.

Optionally, the gate lines, the power connection line VL and the gate electrodes are formed using a same manufacturing process, and the manufacturing material thereof may be, such as argentum (Ag), copper (Cu), aluminum (Al), molybdenum (Mo), or alloy materials of the above metals, such as aluminum neodymium alloy (AlNd), molybdenum niobium alloy (MoNb), or multi-layer metals, such as Mo/Cu/Mo, or a stacked structure formed by metals and transparent conductive materials, such as ITO/Ag/ITO.

Optionally, the data lines Data, the sensing lines Sense, the power line VDD and the source and drain electrodes of the multiple transistors are formed using a same manufacturing process, and the manufacturing material thereof may be, such as argentum (Ag), copper (Cu), aluminum (Al), molybdenum (Mo), or alloy materials of the above metals, such as aluminum neodymium alloy (AlNd), molybdenum niobium alloy (MoNb), or multi-layer metals, such as Mo/Cu/Mo, or a stacked structure formed by metals and transparent conductive materials, such as ITO/Ag/ITO.

Since the repair process is carried out on the source and drain electrode layer and the power connection lines are arranged on the same layer as the gate lines in the present disclosure, and the gate line layer is closest to the source and drain electrode layer, a laser fusing range is reduced, providing technical support for high-resolution product maintenance.

In the embodiment of the present disclosure, part of the gate lines between the gate electrode of the switch transistor located in the first repair sub-pixel and the gate electrode of the switch transistor in the second repair sub-pixel are replaced with the repair line to provide the scanning signals, thus avoiding existence of signals in part of the gate lines between the gate electrode of the switch transistor located in the first repair sub-pixel and the gate electrode of the switch transistor in the second repair sub-pixel when driving is performed to display, and avoiding short circuit between part of the gate lines and the defective data line. The display baseplate according to the embodiment of the present disclosure not only ensures the normal function of the data lines, but also ensures the integrity of the scanning signals provided by the gate lines. Although the first repair sub-pixel and the second repair sub-pixel generate dark points, the normal display of other sub-pixels is ensured, generation of transverse or longitudinal stripes is avoided, and the repair for the display baseplate in which there is a defective point is implemented, thereby improving the display baseplate, increasing the product yield and providing basic support for high-resolution bottom-emitting display products.

A display baseplate according to an embodiment of the present disclosure includes a substrate, gate lines, data lines, power connection lines, and multiple sub-pixels which are defined by crossing of the gate lines and the data lines, arranged on the substrate, wherein each sub-pixel includes a driving circuit; the driving circuit includes multiple transistors and a storage capacitor, there is a defective point formed by a short circuit of a gate line and a data line on the display baseplate, wherein a gate line forming a defective point is a defective gate line; a data line forming the defective point is a defective data line; the multiple transistors include a switch transistor, a driving transistor and a sensing transistor, a first electrode of the storage capacitor is connected to a second electrode of the switch transistor and a gate electrode of the driving transistor respectively, and a second electrode of the storage capacitor is connected to a second electrode of the driving transistor and a second electrode of the sensing transistor respectively. For each sub-pixel, a first electrode of the driving transistor is connected to a power connection line; the power connecting line is arranged on the same layer as gate electrodes of the multiple transistors; the defective gate line is connected respectively to gate electrodes of switch transistors in a first repair sub-pixel and a second repair sub-pixel; wherein the first repair sub-pixel and the second repair sub-pixel are located at both sides of the defective data line respectively and connected to the defective gate line; and a power connection line connected to the first repair sub-pixel and the second repair sub-pixel is a defective power connection line; the defective gate line is disconnected from the defective power connection line, and for the first and second repair sub-pixels, the display baseplate further includes a repair line arranged at one side of source and drain electrodes of the multiple transistors away from the substrate, wherein the repair line is connected respectively to the partially disconnected defective gate line and the partially disconnected defective power connection line and is used for transmitting scanning signals to repair the display baseplate. According to the technical scheme provided by the present disclosure, by disconnecting the defective gate line from the defective power connection line and configuring the repair line connecting the partially disconnected defective gate line and the partially disconnected defective power connection line some of the gate lines forming the defective points do not transmit the scanning signals, i.e., short circuits cannot formed between some of the gate lines forming the defective points and the data lines, thereby implementing the repair for the display baseplate in which there is a defective point, further ensuring the display effect of the display baseplate, increasing the product yield and providing basic support for high-resolution bottom-emitting display products.

Optionally, as shown in FIG. 2, the defective gate line provided by an embodiment of the present disclosure includes a first scanning portion G1, a second scanning portion G2 and a third scanning portion G3 which are arranged along an extending direction of the gate lines and disconnected from each other, wherein the second scanning portion G2 is located between the first scanning portion G1 and the third scanning portion G3.

In an exemplary embodiment, there is an overlap area between an orthogonal projection of the second scanning portion G2 on the substrate 10 and an orthogonal projection of the defective data line on the substrate 10, and the first scanning portion G1 is connected to a gate electrode of a switch transistor in a sub-pixel located at one side of the defective data line close to the first repair sub-pixel; the third scanning portion G3 is connected to a gate electrode of a switch transistor in a sub-pixel located at one side of the defective data line close to the second repair sub-pixel; the repair line is connected to the first scanning portion G1 and the third scanning portion G3 respectively.

In an exemplary embodiment, the first scanning portion G1 is connected to gate electrodes of switch transistors in all sub-pixels located at one side of the defective data line close to the first sub-pixel and arranged in the same row as the first sub-pixel; the third scanning portion G3 is connected to gate electrodes of switch transistors in all the sub-pixels located at one side of the defective data line close to the second sub-pixel and arranged in the same row as the first sub-pixel.

In an exemplary embodiment, the first scanning portion in the present embodiment is connected to an output terminal of a gate driving circuit in the display baseplate for transmitting the scanning signals. In the present embodiment, since the second scanning portion is disconnected from both the first scanning portion and the third scanning portion, there is no signal when driving is performed to display, no short circuit will be formed between the second scanning portion and the defective data line.

Optionally, as shown in FIG. 2, the defective power connection line provided by an embodiment of the present disclosure includes a first connection portion L1, a second connection portion L2 and a third connection portion L3 which are arranged along the extending direction of the gate lines and are disconnected from each other; wherein the second connection portion L2 is located between the first connection portion L1 and the third connection portion L3.

For example, there is an overlap area between an orthogonal projection of the first connection portion L1 on the substrate 10 and the first electrode 33 of the driving transistor in the first repair sub-pixel, and the first connection portion L1 is connected to the first electrode 33 of the driving transistor in the first repair sub-pixel; there is an overlap area between an orthogonal projection of the third connection portion L3 on the substrate 10 and the first electrode 33 of the driving transistor in the second repair sub-pixel, and the third connection portion L3 is connected to the first electrode 33 of the driving transistor in the second repair sub-pixel; there is an overlap area between an orthogonal projection of the second connection portion L2 on the substrate 10 and the second electrodes 24 of the switch transistors in the first repair sub-pixel and the second repair sub-pixel, and the second connection portion L2 is connected to the repair line.

Optionally, as shown in FIG. 2, the repair line provided by an embodiment of the present disclosure includes a first repair portion R1 and a second repair portion R2, wherein the first repair portion R1 is connected to the first scanning portion G1 and the second connection portion L2 respectively; and the second repair portion R2 is connected to the third scanning portion G3 and the second connection portion L2 respectively.

Optionally, a manufacturing material of the first repair portion R1 and the second repair portion R2 includes tungsten.

As shown in FIGS. 2 and 3, in the present embodiment, each of the first repair sub-pixel and the second repair sub-pixel includes a first groove D1 and a second groove D2. The first groove D1 penetrates through the active layer 21 of the switch transistor in the sub-pixel where the first groove D1 is located, and an orthogonal projection of the first groove D1 on the substrate is located between an orthogonal projection of the first electrode 23 of the switch transistor in the sub-pixel where the first groove D1 is located, on the substrate 10, and an orthogonal projection of the gate electrode 22 of the switch transistor in the sub-pixel where the first groove D1 is located, on the substrate 10; the second groove D2 penetrates through the second electrode 24 of the switch transistor in the sub-pixel where the second groove D2 is located, and an orthogonal projection of the second groove D2 on the substrate 10 is located between an orthogonal projection of the power connection line VL on the substrate 10 and an orthogonal projection of the gate electrode 32 of the driving transistor in the sub-pixel where the second groove D2 is located, on the substrate 10.

Optionally, as shown in FIG. 3, in an embodiment each of the first repair sub-pixel and the second repair sub-pixel further includes a first via hole V1 and a second via hole V2, wherein the first via hole V1 in the first repair sub-pixel is used for exposing the first scanning portion G1, the first via hole V1 in the second repair sub-pixel is used for exposing the third scanning portion G3, and the second via holes V2 are used for exposing the second connection portion L2.

The first repair portion R1 is connected to the first scanning portion G1 through the first via hole V1 in the first repair sub-pixel, and the first repair portion R1 is connected to the second connection portion L2 through the second via hole V2 in the first repair sub-pixel; the second repair portion R2 is connected to the third scanning portion G3 through the first via hole V1 in the second repair sub-pixel; and the second repair portion R2 is connected to the second connection portion L2 through the second via hole V2 in the second repair sub-pixel.

Optionally, the first repair portion R1 and the second repair portion R2 are formed using the same manufacturing process, and their manufacturing material is metal, such as tungsten, and the embodiments of the present disclosure are not limited thereto.

Optionally, as shown in FIG. 2, the storage capacitor C is a transparent capacitor, the first electrode C1 of the storage capacitor C is arranged on the same layer as active layers of the multiple transistors, and the second electrode C2 of the storage capacitor is arranged at one side of the source and drain electrodes of the multiple transistors away from the substrate.

Optionally, a manufacturing material of the second electrode is a transparent conductive material, and a manufacturing material of the first electrode is the same as that of the active layers of the multiple transistors.

Optionally, as shown in FIG. 2, each sub-pixel includes a storage capacitor region provided with a storage capacitor, and a non-storage capacitor region provided with the multiple transistors.

The non-storage capacitor region includes a first non-storage capacitor region and a second non-storage capacitor region; the first non-storage capacitor region and the second non-storage capacitor region are located at both sides of the storage capacitor region respectively, the switch transistor and the driving transistor are located in the first non-storage capacitor region, and the sensing transistor is located in the second non-storage capacitor region.

In the present embodiment, for each sub-pixel in an ith row, the gate electrode of the switch transistor is connected to a gate line in an ith row, and the gate electrode of the sensing transistor is connected to a gate line in an (i+1)th row, and the gate line in the ith row and the gate line in the (i+1)th row are located at both sides of the storage capacitor region of sub-pixels in the ith row respectively.

In an exemplary embodiment, as shown in FIG. 2, the display baseplate provided by the embodiment of the present disclosure further includes power lines VDD, sensing lines Sense and data lines Data which are arranged in a same layer as the source and drain electrodes of the multiple transistors; for each sub-pixel, the first electrode 33 of the driving transistor is connected to the power line VDD through the power connection line VL, and the first electrode 43 of the sensing transistor is connected to the sensing line Sense.

Each pixel includes four sub-pixels, each pixel is connected to four columns of data lines, one column of power lines, and two columns of sensing lines, respectively, each sub-pixel corresponds to one column of data lines, and each pixel corresponds to one column of power line and two columns of sensing lines.

The four sub-pixels are arranged along the extending direction of the gate lines in sequence, and a power line corresponding to each pixel is arranged between a second sub-pixel and a third sub-pixel, a sensing line in a first column is arranged at one side of a first sub-pixel away from the second sub-pixel, and a sensing line in a second column is arranged at one side of a fourth sub-pixel away from the third sub-pixel; a data line corresponding to the first sub-pixel is located at one side of the first sub-pixel close to the second sub-pixel; a data line corresponding to the second sub-pixel is located at one side of the second sub-pixel close to the first sub-pixel, a data line corresponding to the third sub-pixel is located at one side of the third sub-pixel close to the fourth sub-pixel; and a data line corresponding to the fourth sub-pixel is located at one side of the fourth sub-pixel close to the third sub-pixel.

An arrangement mode of the four sub-pixels in each pixel may be, but is not limited to RWBG.

There are four sub-pixels between two sensing lines Sense and there are four sub-pixels between two power lines VDD. FIG. 2 is illustrated by taking the four sub-pixels between two power lines as an example.

Optionally, the display baseplate further includes sensing connection lines connected to the sensing lines; a light shielding layer is disposed at one side of a buffer layer close to the substrate, the sensing connection lines are arranged on the same layer as the light shielding layer, and an orthogonal projection of the light shielding layer on the substrate covers that of an active area of an active layer of the driving transistor on the substrate; for each sub-pixel, the first electrode of the sensing transistor is connected to the sensing lines through the sensing connection lines.

In the display baseplate provided by the embodiments of the present disclosure, a channel for transmitting signals to the defective points, i.e., a gate line between the gate electrode of the switch transistor in the first repair sub-pixel and the gate electrode of the switch transistor in the second repair sub-pixel, is disconnected, a new channel for transmitting scanning signals is set, and a new signal line for scanning signals is formed, such that the integrity of the scanning signals is ensured, and the normal operation of products is ensured, thereby improving the product yield.

Figure 4:
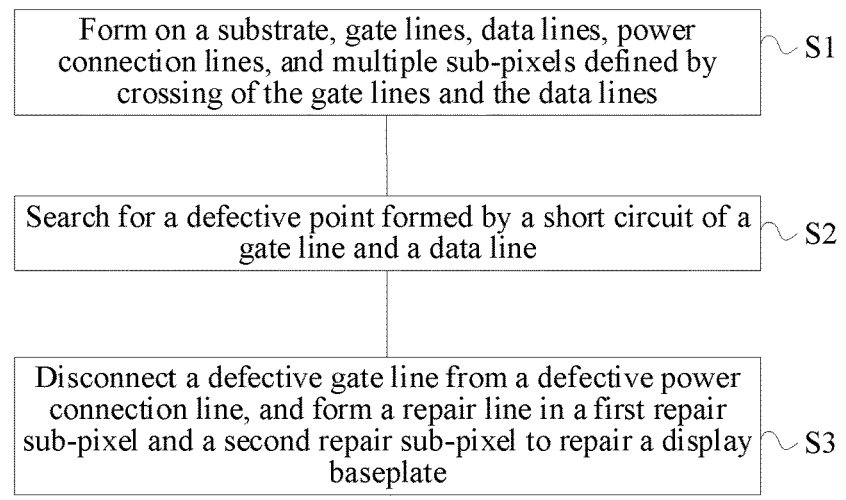
FIG. 4 is a flow chart of a method for manufacturing a display baseplate according to an embodiment of the present disclosure.

In an exemplary embodiment, an embodiment of the present disclosure further provides a method for manufacturing a display baseplate. FIG. 4 is a flow chart of the method for manufacturing the display baseplate according to an embodiment of the present disclosure. As shown in FIG. 4, the method for manufacturing the display baseplate according to the embodiment of the present disclosure includes acts S1 to S3.

In act S1, gate lines, data lines, power connection lines, and multiple sub-pixels defined by crossing of the gate lines and the data lines are formed on a substrate.

Each sub-pixel includes a driving circuit; the driving circuit includes multiple transistors and a storage capacitor; the storage capacitor is a transparent capacitor, and the multiple transistors include a switch transistor, a driving transistor and a sensing transistor; a first electrode of the storage capacitor is connected to a second electrode of the switch transistor and a gate electrode of the driving transistor respectively, and a second electrode of the storage capacitor is connected to a second electrode of the driving transistor and a second electrode of the sensing transistor respectively; for each sub-pixel, a first electrode of the driving transistor is connected to a power connection line; the power connecting line is arranged on the same layer as gate electrodes of the multiple transistors.

Optionally, act S1 includes forming a light shielding layer and sensing connection lines on the substrate; forming a buffer layer on the light shielding layer and the sensing connection lines; forming active layers of the multiple transistors and the first electrode of the storage capacitor on the buffer layer; forming a gate insulating layer on the active layers of the multiple transistors and the first electrode of the storage capacitor; forming the gate lines, the gate electrodes of the multiple transistors and the power connection lines on the gate insulating layer; forming an interlayer insulating layer on the gate lines, the gate electrodes of the multiple transistors and the power connection lines; and forming the data lines, power lines, sensing lines and source and drain electrodes of the multiple transistors on the interlayer insulating layer.

In act S2, a defective point formed by a short circuit of a gate line and a data line is searched for.

Act S2 includes searching for the defective point in the display baseplate using a searching approach for the defective point in related technologies.

A gate line forming a defective point is a defective gate line, a data line forming the defective point is a defective data line, a first repair sub-pixel and a second repair sub-pixel are located at both sides of the defective data line respectively, and are connected to the defective data line, and a power connection line connected to the first repair sub-pixel and the second repair sub-pixel is a defective power connection line.

In act S3, the defective gate line is disconnected from the defective power connection line, and a repair line is formed in the first and second repair sub-pixels to repair the display baseplate.

The repair line is arranged at one side of the source and drain electrodes of the multiple transistors away from the substrate, the repair line is connected respectively to the partially disconnected defective gate line and the partially disconnected defective power connection line and is used for transmitting scanning signals to repair the display baseplate.

Disconnecting the defective gate line from the defective power connection line includes: cutting the defective gate line into a first scanning portion, a second scanning portion and a third scanning portion disconnected from each other, along an arrangement direction of the gate lines using a laser process; cutting the defective power connection line into a first connection portion, a second connection portion and a third connection portion disconnected from each other, along the arrangement direction of the gate lines using the laser process; forming a first groove, a second groove, a first via hole and a second via hole in the first repair sub-pixel and the second repair sub-pixel using the laser process.

There is an overlap area between an orthogonal projection of the second scanning portion on the substrate and an orthogonal projection of the defective data line on the substrate, and the first scanning portion is connected to a gate electrode of a switch transistor in a sub-pixel located at one side of the defective data line close to the first repair sub-pixel; the third scanning portion is connected to a gate electrode of a switch transistor in a sub-pixel located at one side of the defective data line close to the second repair sub-pixel. There is an overlap area between An orthogonal projection of the first connection portion on the substrate and the first electrode of the driving transistor in the first repair sub-pixel, and the first connection portion is connected to the first electrode of the driving transistor in the first repair sub-pixel; there is an overlap area between an orthogonal projection of the third connection portion on the substrate and the first electrode of the driving transistor in the second repair sub-pixel, and the third connection portion is connected to the first electrode of the driving transistor in the second repair sub-pixel; there is an overlap area between an orthogonal projection of the second connection portion on the substrate and the second electrodes of the switch transistors in the first repair sub-pixel and the second repair sub-pixel, and the second connection portion is connected to the repair line. The first groove penetrates through the active layer of the switch transistor in the sub-pixel where the first groove is located, and an orthogonal projection of the first groove on the substrate is located between an orthogonal projection of the first electrode of the switch transistor in the sub-pixel where the first groove is located, on the substrate and an orthogonal projection of the gate electrode of the switch transistor in the sub-pixel where the first groove is located, on the substrate. The second groove penetrates through the second electrode of the switch transistor in the sub-pixel where the second groove is located, and an orthogonal projection of the second groove on the substrate is located between an orthogonal projection of the power connection line on the substrate and an orthogonal projection of the gate electrode of the driving transistor in the sub-pixel where the second groove is located, on the substrate; wherein the first via hole in the first repair sub-pixel is used for exposing the first scanning portion, the first via hole in the second repair sub-pixel is used for exposing the third scanning portion, and the second via hole is used for exposing the second connection portion.

Forming the repair line in the first and second repair sub-pixels to repair the display baseplate includes: depositing a metal film on the first sub-pixel and the second sub-pixel; forming a first repair portion in the first sub-pixel and a second repair portion in the second sub-pixel through a patterning process to form the repair line.

The first repair portion is connected to the first repair portion through the first via hole in the first repair sub-pixel, and the first repair portion is connected to the second connection portion through the second via hole in the first repair sub-pixel; the second repair portion is connected to the third scanning portion through the first via hole in the second repair sub-pixel, and the second repair portion is connected to the second connection portion through the second via hole in the second repair sub-pixel.

Optionally, the method for manufacturing the display baseplate according to an embodiment of the present disclosure further includes: forming a second electrode of the storage capacitor on the data lines, the power lines, the sensing lines and the source and drain electrodes of the multiple transistors.

The display baseplate is a display baseplate provided by the embodiments described above, and implementation principles and implementation effects thereof are similar and which will not be repeated herein.

Since the repair process is carried out on the source and drain electrode layer and in the present disclosure the power connection lines are arranged on the same layer as the gate lines, and the gate line layer is closest to the source and drain electrode layer, a laser fusing range is reduced, providing technical support for high-resolution product maintenance.

The technical scheme of the present embodiment will be further described below through a process for manufacturing the display baseplate according to the present embodiment. The "patterning process" mentioned in the present embodiment includes processes, such as film layer deposition, photoresist coating, mask exposure, development, etching, and photoresist stripping. Processes such as sputtering, evaporation, chemical vapor deposition may be used for deposition, and are not limited herein. In the description of the present embodiment, it should be understood that "thin film" refers to a layer of thin film made of a certain material by deposition or other processes on the substrate. If the patterning process is not required for the "thin film" throughout the manufacturing process, the "thin film" may also be called a "layer". If the patterning process is required for the "thin film" throughout the manufacturing process, the "thin film" is called a "thin film" before the patterning process and is called a "layer" after the patterning process. The "layer" after the patterning process contains at least one "pattern".

Figure 5A:
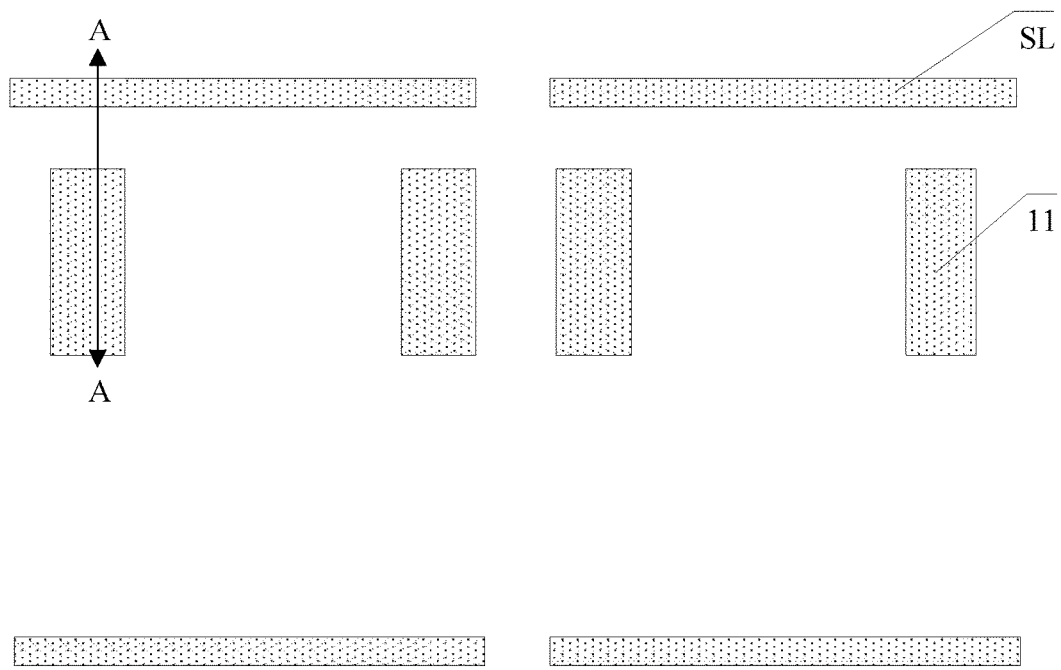
FIG. 5A is a schematic diagram one of a method for manufacturing a display baseplate according to an embodiment of the present disclosure.
Figure 5B:
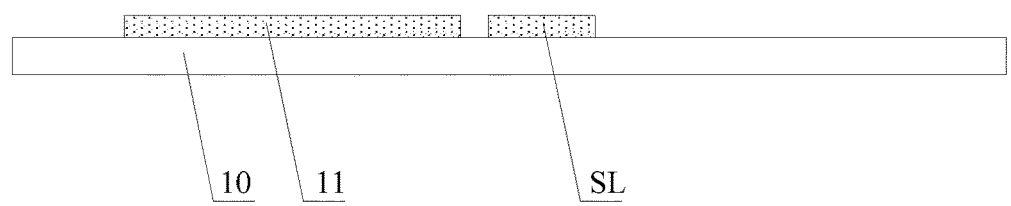
FIG. 5B is a sectional view taken along an A-A direction in FIG. 5A.
Figure 6A:
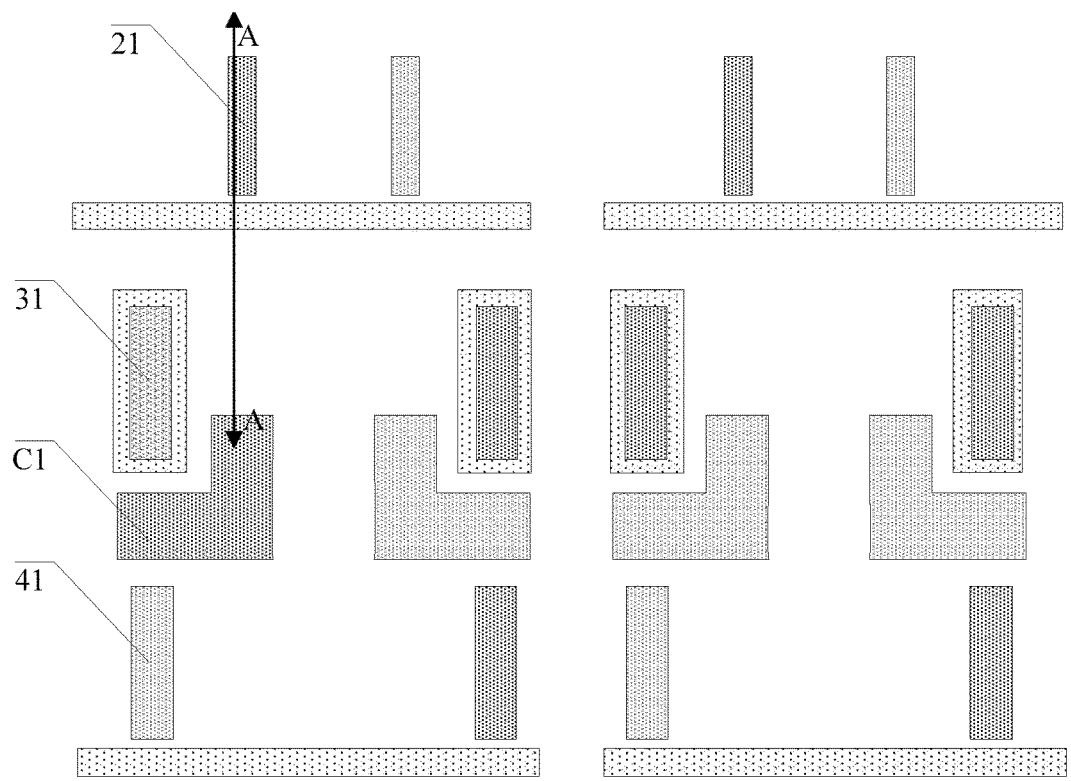
FIG. 6A is a schematic diagram two of a method for manufacturing a display baseplate according to an embodiment of the present disclosure.
Figure 6B:
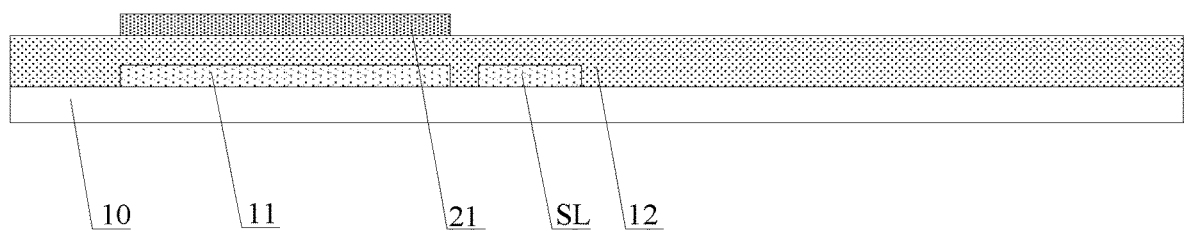
FIG. 6B is a sectional view taken along an A-A direction in FIG. 6A.
Figure 7A:
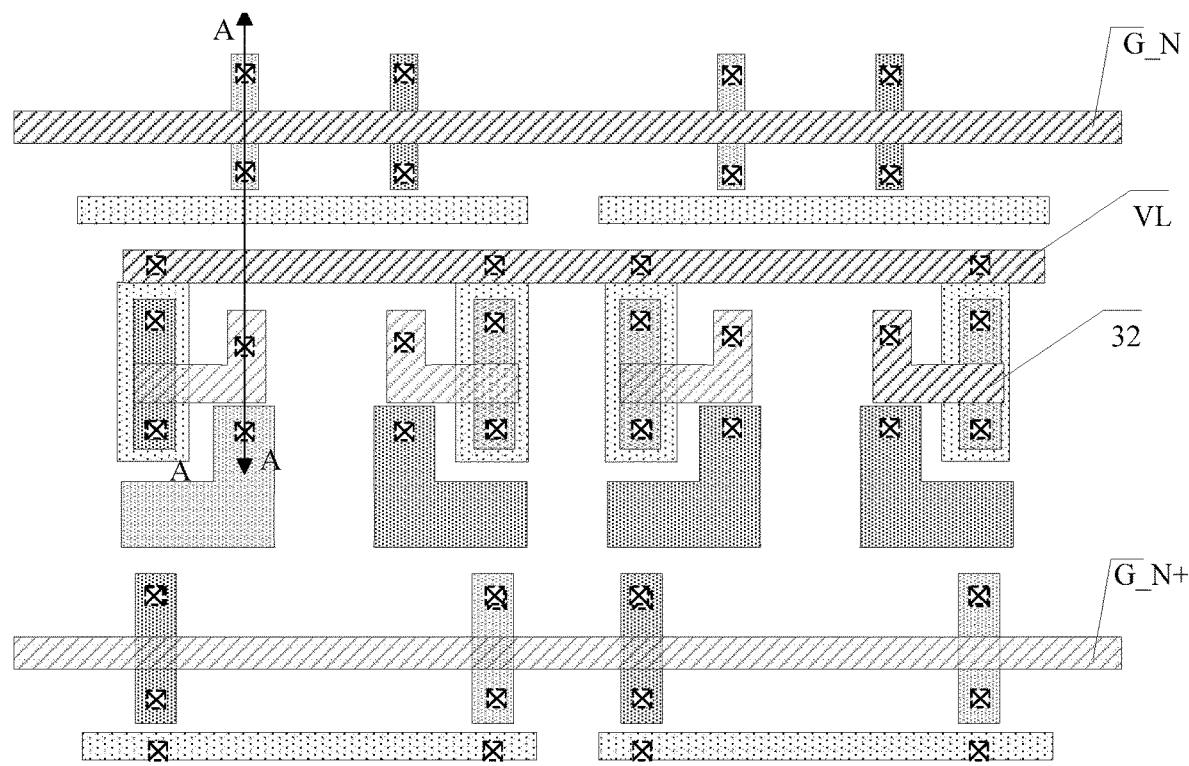
FIG. 7A is a schematic diagram three of a method for manufacturing a display baseplate according to an embodiment of the present disclosure.
Figure 7B:
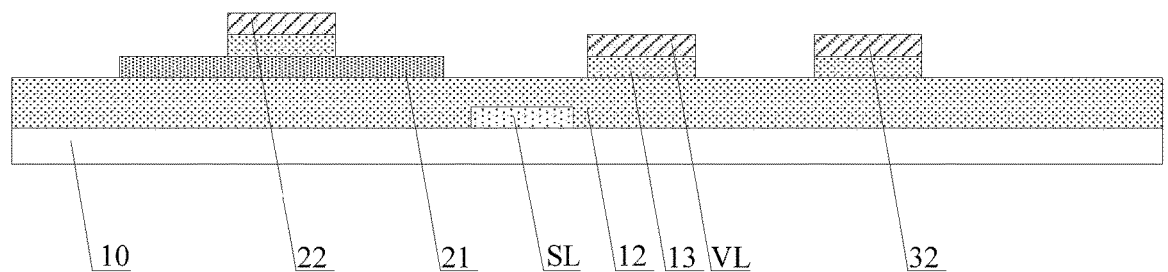
FIG. 7B is a sectional view taken along an A-A direction in FIG. 7A.
Figure 8A:
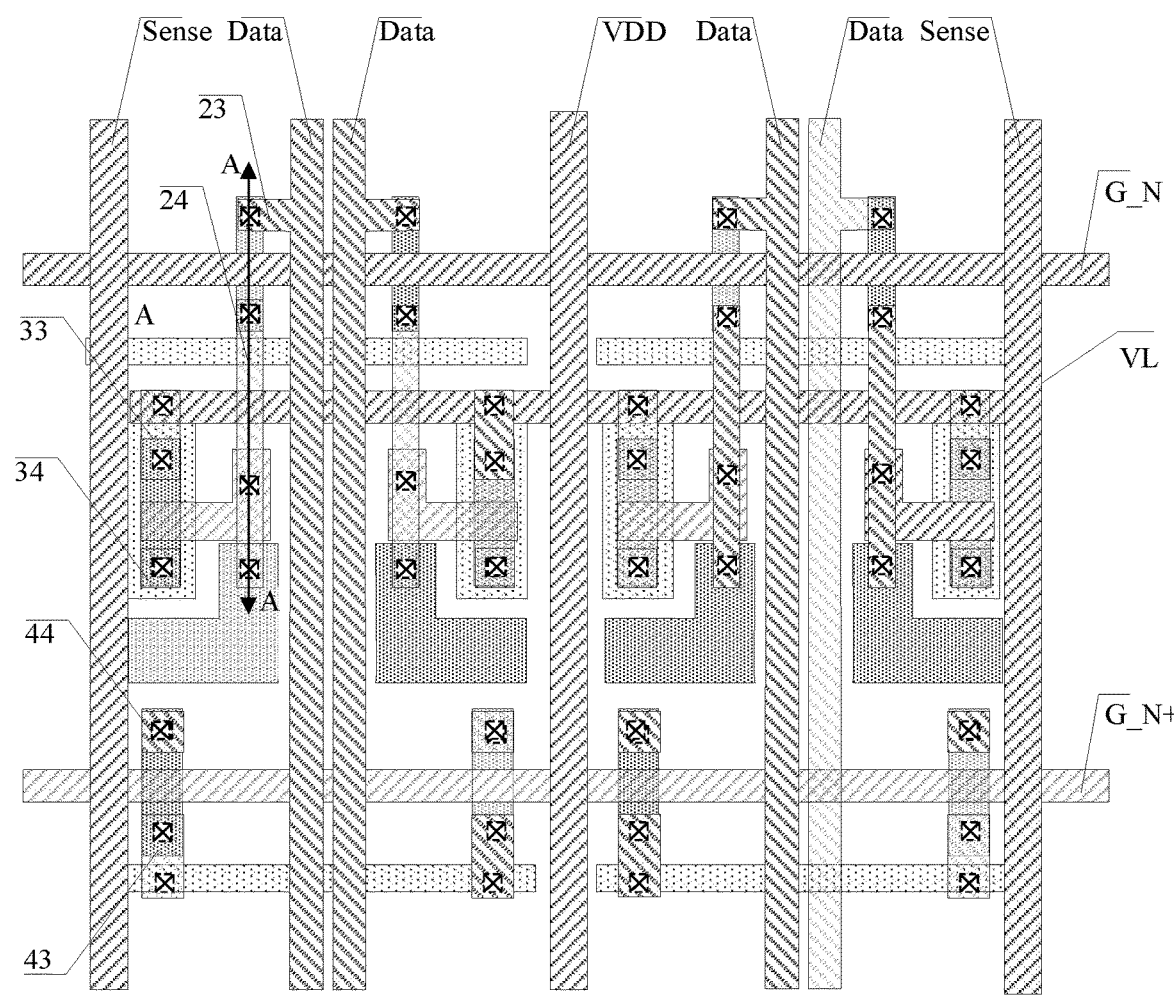
FIG. 8A is a schematic diagram four of a method for manufacturing a display baseplate according to an embodiment of the present disclosure.
Figure 8B:
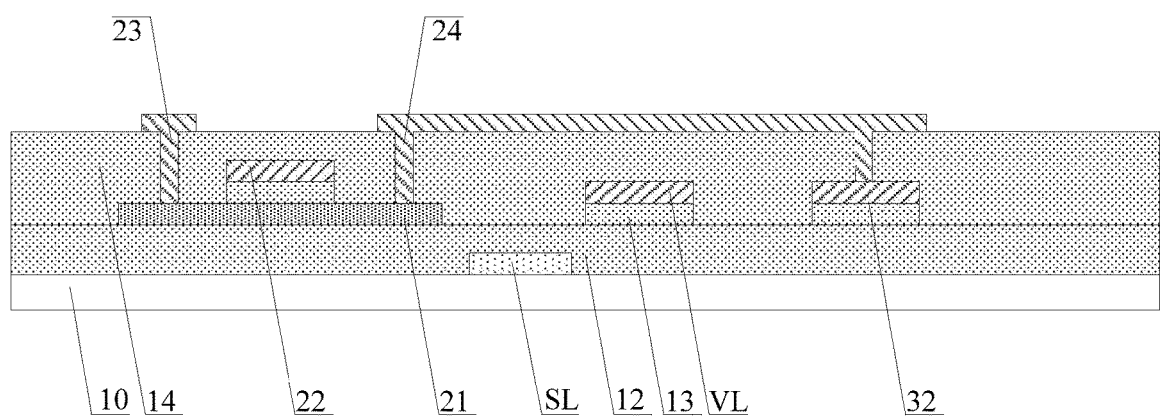
FIG. 8B is a sectional view taken along an A-A direction in FIG. 8A.
Figure 9A:
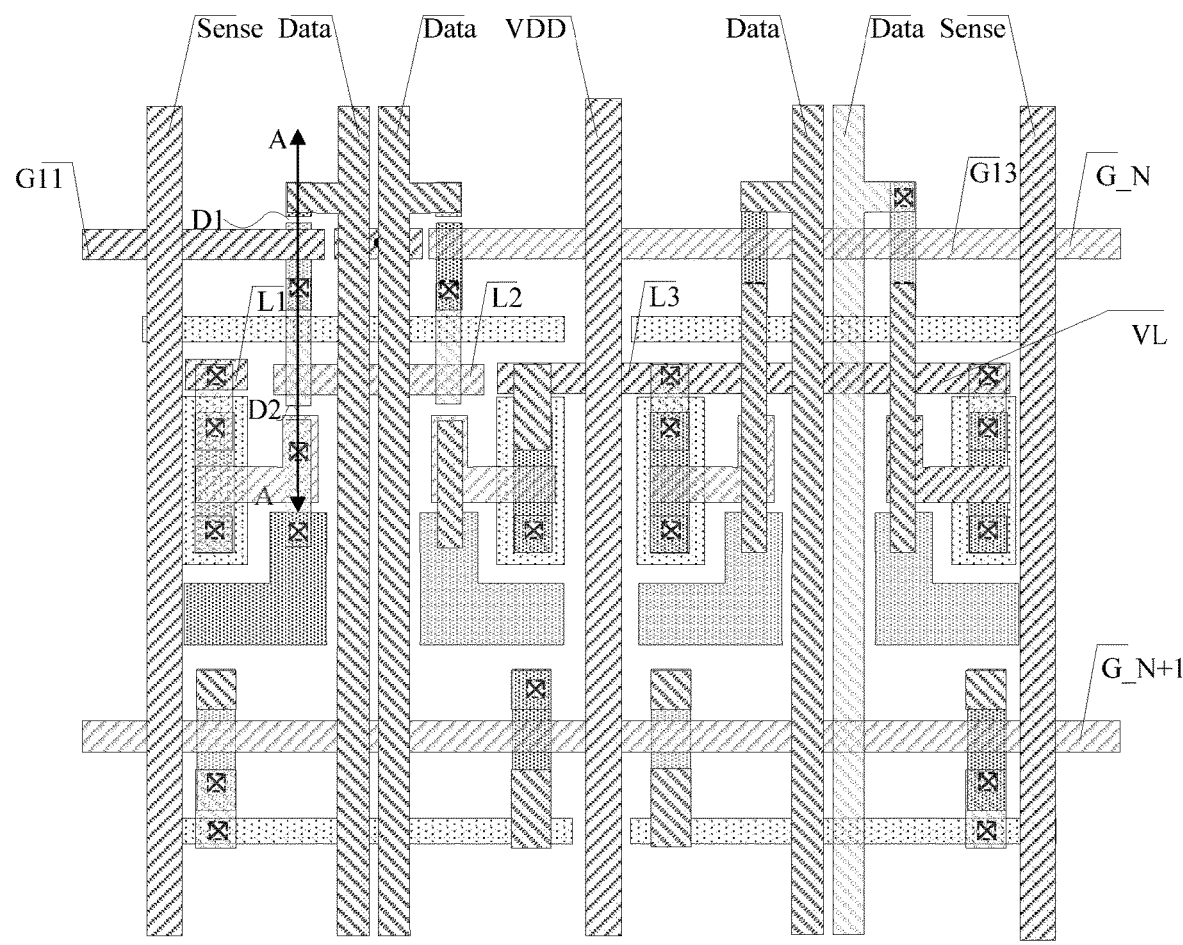
FIG. 9A is a schematic diagram five of a five method for manufacturing a display baseplate according to an embodiment of the present disclosure.
Figure 9B:
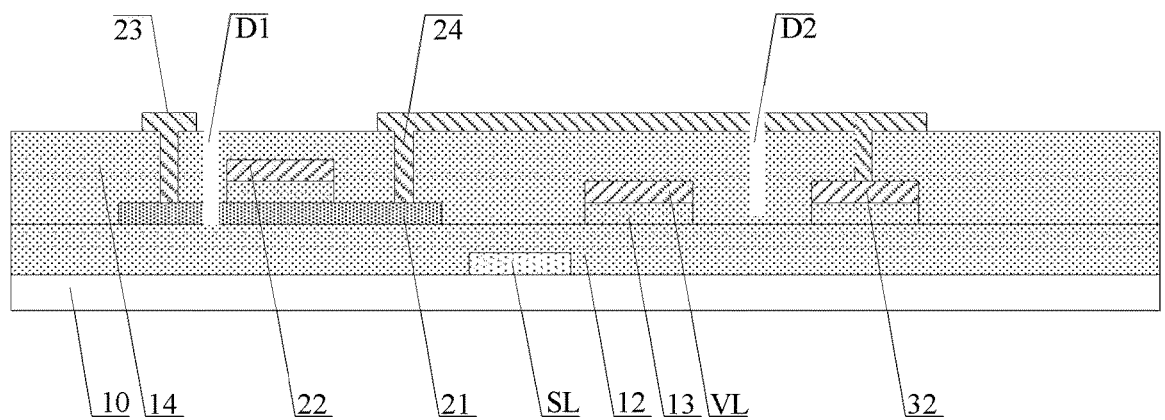
FIG. 9B is a sectional view taken along an A-A direction in FIG. 9A.
Figure 10A:
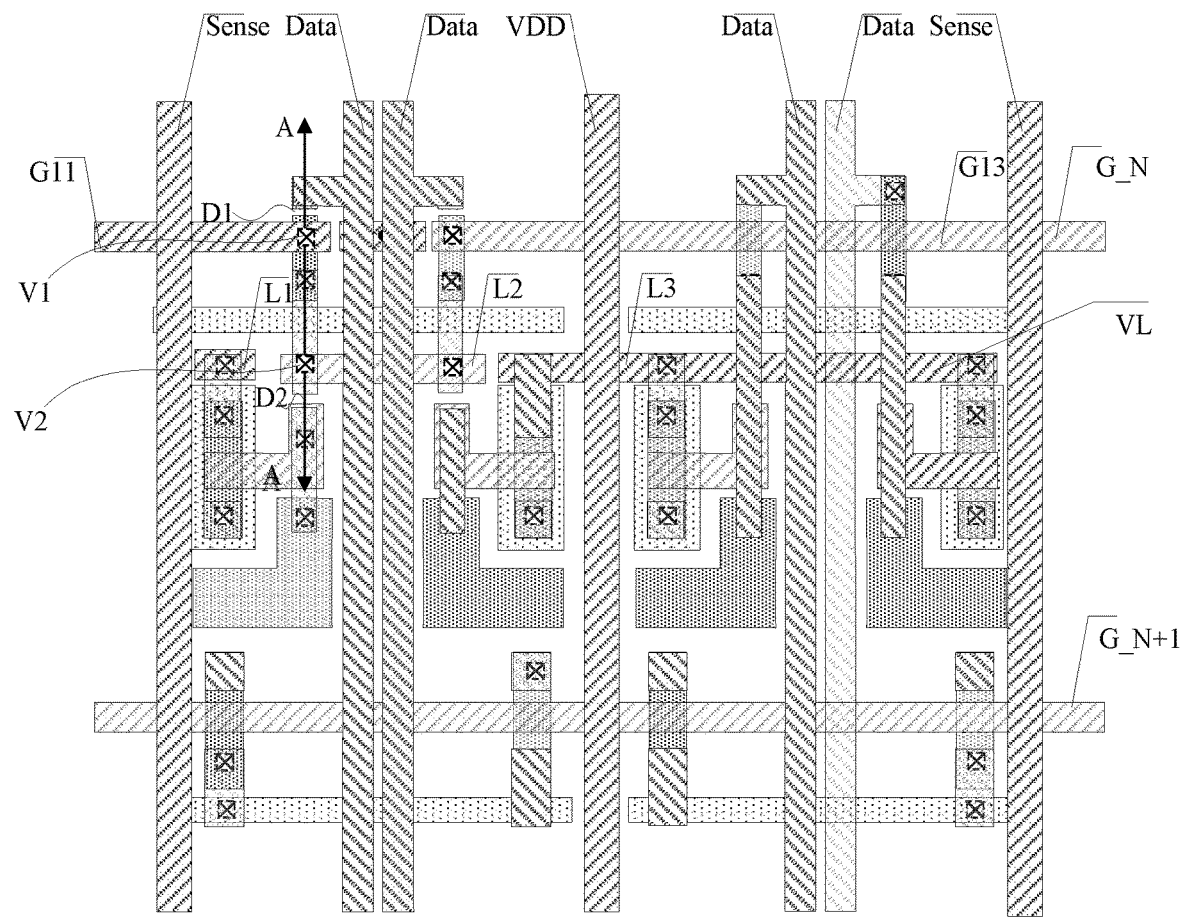
FIG. 10A is a schematic diagram six of a method for manufacturing a display baseplate according to an embodiment of the present disclosure.
Figure 10B:
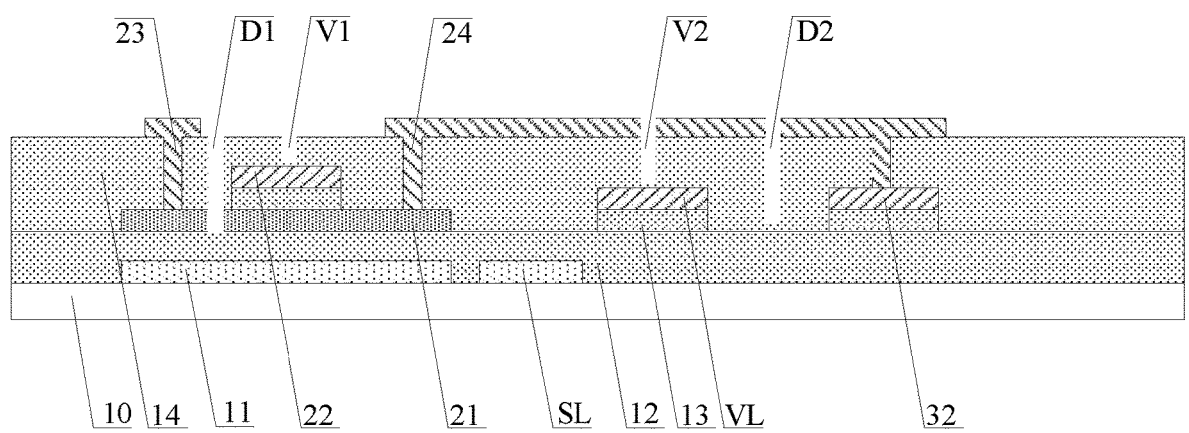
FIG. 10B is a sectional view taken along an A-A direction in FIG. 10A.

FIG. 5A is a schematic diagram one of a method for manufacturing a display baseplate according to an embodiment of the present disclosure, FIG. 5B is a sectional view taken along an A-A direction in FIG. 5A. FIG. 6A is a schematic diagram two of a method for manufacturing a display baseplate according to an embodiment of the present disclosure, FIG. 6B is a sectional view taken along an A-A direction in FIG. 6A. FIG. 7A is a schematic diagram three of a method for manufacturing a display baseplate according to an embodiment of the present disclosure, FIG. 7B is a sectional view taken along an A-A direction in FIG. 7A. FIG. 8A is a schematic diagram four of a method for manufacturing a display baseplate according to an embodiment of the present disclosure, FIG. 8B is a sectional view taken along an A-A direction in FIG. 8A. FIG. 9A is a schematic diagram five of a fifth method for manufacturing a display baseplate according to an embodiment of the present disclosure, FIG. 9B is a sectional view taken along an A-A direction in FIG. 9A. FIG. 10A is a schematic diagram six of a method for manufacturing a display baseplate according to an embodiment of the present disclosure; and FIG. 10B is a sectional view taken along an A-A direction in FIG. 10A, wherein light shielding layers 11 shown in the FIG. 6B and FIG. 10B are not shown in FIG. 6A and FIG. 10A. FIG. 6B and FIG. 10B show possible examples. In the examples shown by FIG. 6B and FIG. 10B, an orthogonal projection of the light shielding layer on the substrate covers that of an active area of an active layer 21 of a switch transistor on the substrate. The method for manufacturing the display baseplate according to the embodiments of the present disclosure is described in conjunction with FIGS. 5 to 10, which are illustrated by taking four sub-pixels formed simultaneously as an example.

In act 100, a substrate 10 is provided, and a light shielding layer 11 and a sensing connection line SL are formed on the substrate 10 using a same manufacturing process, as shown in FIGS. 5A and 5B.

In act 200, a buffer layer 12 covering the substrate 10 is formed, and an active layer 21 of a switch transistor, an active layer 31 of a driving transistor, an active layer 41 of a sensing transistor and a first electrode C1 of a storage capacitor are formed on the buffer layer 12, as shown in FIGS. 6A and 6B.

In act 300, a gate insulating layer 13 is formed, and a gate line G_N, a second gate line G_N+1, a power connection line VL, a gate electrode 22 of the switch transistor, a gate electrode 32 of the driving transistor and a gate electrode of the sensing transistor (not shown in the figure) are formed on the gate insulating layer 13 using a same manufacturing process, as shown in FIGS. 7A and 7B.

In act 400, an interlayer insulating layer 14 is formed, and first and second electrodes 23 and 24 of the switch transistor, first and second electrodes 33 and 34 of the driving transistor, first and second electrodes 43 and 44 of the sensing transistor, data lines Data, power lines VDD, sensing lines Sense and a second electrode C2 of the storage capacitor are formed on the interlayer insulating layer 14, as shown in FIGS. 8A and 8B.

The source and drain electrodes of the multiple transistors, the data lines, the power lines and the sensing lines may be formed by the same manufacturing process, and the embodiments of the present disclosure are not limited thereto.

In act 500, a defective gate line is cut, along an arrangement direction of the gate lines using a laser process, into a first scanning portion G1, a second scanning portion G2 and a third scanning portion G3 arranged along an extending direction of the gate lines and disconnected from each other; a first groove D1 and a second groove D2 are formed in the first repair sub-pixel and the second repair sub-pixel using the laser process; the power connection line VL is cut, along the arrangement direction of the gate lines using the laser process, into a first connection portion L1, a second connection portion L2 and a third connection portion L3 arranged along the extending direction of the gate lines and disconnected from each other, as shown in FIGS. 9A and 9B.

In act 600, a first via V1 and a second via V2 are formed in the first repair sub-pixel and the second repair sub-pixel, as shown in FIGS. 10A and 10B.

In act 700, a first repair portion R1 is formed in the first repair sub-pixel and a second repair portion R2 is formed in the second repair sub-pixel to form a repair line, as shown in FIGS. 2 and 3.

In an exemplary embodiment, an embodiment of the present disclosure further provides a display device including a display baseplate.

The display baseplate is the display baseplate provided by the embodiments described above, and their implementation principles and implementation effects are similar, and will not be repeated herein.

Optionally, the display device may be any product or component with a display function, such as a mobile phone, a tablet computer, a television, a display, a laptop computer, a digital photo frame, a navigator, etc. Other essential components included by the display device which should be understood by those of ordinary skill in the art will not be described repeatedly herein, and should not be taken as a limitation to the present disclosure.

For the sake of clarity, thicknesses and sizes of layers or microstructures are exaggerated in the drawings used to describe the embodiments of the present disclosure. It may be understood that when an element such as a layer, film, region or baseplate is taken as being "on" or "under" another element, the element may be "on" or "under" the another element "directly", or an intervening element therebetween may exist.

Although the implementations disclosed in the present disclosure are described above, the described contents are only the implementations for facilitating understanding of the present disclosure, and are not intended to limit the present disclosure. Any person skilled in the art to which the present disclosure pertains may make any modification and variation in forms and details of implementation without departing from the spirit and scope disclosed in the present disclosure, however, the patent protection scope of the present disclosure shall still be subject to the scope defined by the appended claims.

What we claim is:

1. A display baseplate, comprising a substrate, gate lines, data lines, power connection lines, and a plurality of sub-pixels which are defined by crossing of the gate lines and the data lines, wherein the gate lines, the data lines and the power connection lines, and the plurality of sub-pixels are arranged on the substrate, each sub-pixel comprises a driving circuit; the driving circuit comprises a plurality of transistors and a storage capacitor, there is a defective point formed by a short circuit of a gate line and a data line on the display baseplate, wherein a gate line forming a defective point is a defective gate line; a data line forming a defective point is a defective data line; the plurality of transistors comprise a switch transistor, a driving transistor and a sensing transistor, a first electrode of the storage capacitor is connected to a second electrode of the switch transistor and a gate electrode of the driving transistor respectively, and a second electrode of the storage capacitor is connected to a second electrode of the driving transistor and a second electrode of the sensing transistor respectively;

for each sub-pixel, a first electrode of the driving transistor is connected to a power connection line; the power connecting line is arranged on a same layer as gate electrodes of the plurality of transistors; a defective gate line is connected respectively to gate electrodes of switch transistors in a first repair sub-pixel and a second repair sub-pixel; wherein the first repair sub-pixel and the second repair sub-pixel are located at both sides of a defective data line respectively, and a power connection line connected to the first repair sub-pixel and the second repair sub-pixel is a defective power connection line; and the defective gate line is disconnected from the defective power connection line, and for the first repair sub-pixel and the second repair sub-pixel, the display baseplate further comprises a repair line arranged at one side of source and drain electrodes of the plurality of transistors away from the substrate, wherein the repair line is connected respectively to a partially disconnected defective gate line and a partially disconnected defective power connection line and is used for transmitting scanning signals to repair the display baseplate.

2. The display baseplate according to claim 1, wherein the defective gate line comprises a first scanning portion, a second scanning portion and a third scanning portion which are arranged along an extending direction of the gate lines and disconnected from each other, wherein the second scanning portion is located between the first scanning portion and the third scanning portion;

there is an overlap area between an orthogonal projection of the second scanning portion on the substrate and an orthogonal projection of the defective data line on the substrate, and the first scanning portion is connected to a gate electrode of a switch transistor in a sub-pixel located at one side of the defective data line close to the first repair sub-pixel; the third scanning portion is connected to a gate electrode of a switch transistor in a sub-pixel located at one side of the defective data line close to the second repair sub-pixel; and the repair line is connected to the first scanning portion and the third scanning portion respectively.

3. The display baseplate according to claim 2, wherein the defective power connection line comprises a first connection portion, a second connection portion and a third connection portion which are arranged along the extending direction of the gate lines and are disconnected from each other; wherein the second connection portion is located between the first connection portion and the third connection portion; and there is an overlap area between an orthogonal projection of the first connection portion on the substrate and a first electrode of a driving transistor in the first repair sub-pixel, and the first connection portion is connected to the first electrode of the driving transistor in the first repair sub-pixel; there is an overlap area between an orthogonal projection of the third connection portion on the substrate and a first electrode of a driving transistor in the second repair sub-pixel, and the third connection portion is connected to the first electrode of the driving transistor in the second repair sub-pixel; there is an overlap area between an orthogonal projection of the second connection portion on the substrate second electrodes of switch transistors in the first repair sub-pixel and the second repair sub-pixel, and the second connection portion is connected to the repair line.

4. The display baseplate according to claim 3, wherein the repair line comprises a first repair portion and a second repair portion;

wherein the first repair portion is connected to the first scanning portion and the second connection portion respectively; and the second repair portion is connected to the third scanning portion and the second connection portion respectively.

5. The display baseplate according to claim 4, wherein a manufacturing material of the first repair portion and the second repair portion comprises tungsten.

6. The display baseplate according to claim 4, wherein each of the first repair sub-pixel and the second repair sub-pixel comprises a first groove and a second groove;

wherein the first groove penetrates through an active layer of a switch transistor in a sub-pixel where the first groove is located, and an orthogonal projection of the first groove on the substrate is located between an orthogonal projection of a first electrode of a switch transistor in a sub-pixel where the first groove is located, on the substrate, and an orthogonal projection of a gate electrode of the switch transistor in the sub-pixel where the first groove is located, on the substrate; and the second groove penetrates through a second electrode of a switch transistor in a sub-pixel where the second groove is located, and an orthogonal projection of the second groove on the substrate is located between an orthogonal projection of the power connection line on the substrate and an orthogonal projection of a gate electrode of a driving transistor in a sub-pixel where the second groove is located, on the substrate.

7. The display baseplate according to claim 4, wherein each of the first repair sub-pixel and the second repair sub-pixel further comprises a first via hole and a second via hole;

wherein the first via hole in the first repair sub-pixel is used for exposing the first scanning portion, the first via hole in the second repair sub-pixel is used for exposing the third scanning portion, and the second via hole is used for exposing the second connection portion.

8. The display baseplate according to claim 7, wherein the first repair portion is connected to the first scanning portion through the first via hole in the first repair sub-pixel, and the first repair portion is connected to the second connection portion through the second via hole in the first repair sub-pixel; the second repair portion is connected to the third scanning portion through the first via hole in the second repair sub-pixel; and the second repair portion is connected to the second connection portion through the second via hole in the second repair sub-pixel.

9. The display baseplate according to claim 1, wherein the storage capacitor is a transparent capacitor, a first electrode of the storage capacitor is arranged on a same layer as active layers of the plurality of transistors, and a second electrode of the storage capacitor is arranged at one side of source and drain electrodes of the plurality of transistors away from the substrate; and a manufacturing material of the second electrode is a transparent conductive material, and a manufacturing material of the first electrode is the same as that of the active layers of the plurality of transistors.

10. The display baseplate according to claim 1, wherein each sub-pixel comprises a storage capacitor region provided with the storage capacitor and a non-storage capacitor region provided with the plurality of transistors; and the non-storage capacitor region comprises a first non-storage capacitor region and a second non-storage capacitor region; the first non-storage capacitor region and the second non-storage capacitor region are located at both sides of the storage capacitor region respectively, the switch transistor and the driving transistor are located in the first non-storage capacitor region, and the sensing transistor is located in the second non-storage capacitor region.

11. The display baseplate according to claim 1, wherein for each sub-pixel in an ith row, the gate electrode of the switch transistor is connected to a gate line in an ith row, and the gate electrode of the sensing transistor is connected to a gate line in an (i+1)th row, and the gate line in the ith row and the gate line in the (i+1)th row are located at both sides of a storage capacitor region of sub-pixels in the ith row respectively.

12. The display baseplate according to claim 1, further comprising power lines, sensing lines and data lines which are arranged in a same layer as the source and drain electrodes of the plurality of transistors; for each sub-pixel, the first electrode of the driving transistor is connected to a power line through a power connection line, and the first electrode of the sensing transistor is connected to a sensing line;
   each pixel comprises four sub-pixels, each pixel is connected to four columns of data lines, one column of power line, and two columns of sensing lines, respectively, each sub-pixel corresponds to one column of data line, and each pixel corresponds to one column of power line and two columns of sensing lines;
   the four sub-pixels are arranged along the extending direction of the gate lines in sequence, and a power line corresponding to each pixel is arranged between a second sub-pixel and a third sub-pixel, a power line in a first column is arranged at one side of a first sub-pixel away from the second sub-pixel, and a power line in a second column is arranged at one side of a fourth sub-pixel away from the third sub-pixel; and
   a data line corresponding to the first sub-pixel is located at one side of the first sub-pixel close to the second sub-pixel; a data line corresponding to the second sub-pixel is located at one side of the second sub-pixel close to the first sub-pixel, a data line corresponding to the third sub-pixel is located at one side of the third sub-pixel close to the fourth sub-pixel; and a data line corresponding to the fourth sub-pixel is located at one side of the fourth sub-pixel close to the third sub-pixel.

13. The display baseplate according to claim 11, further comprising a buffer layer and a light shielding layer disposed at one side of the active layers of the plurality of transistors close to the substrate; and sensing connection lines connected to the sensing lines;
   the light shielding layer is disposed at one side of the buffer layer close to the substrate, the sensing connection lines are arranged on a same layer as the light shielding layer, and an orthogonal projection of the light shielding layer on the substrate covers that of an active area of an active layer of the driving transistor on the substrate; and
   for each sub-pixel, the first electrode of the sensing transistor is connected to the sensing lines through the sensing connection lines.

14. The display baseplate according to claim 13, further comprising a gate insulating layer disposed between the active layers of the plurality of transistors and the gate electrodes of the plurality of transistors, and an interlayer insulating layer disposed between the active layers of the plurality of transistors and the source and drain electrodes of the plurality of transistors; and
   an orthographic projection of the gate insulating layer on the substrate coincides with an orthographic projection of the gate electrodes of the plurality of transistors on the substrate, and the first via hole is provided on the interlayer insulating layer.

15. A display device, comprising the display baseplate according to claim 1.

16. A method for manufacturing the display baseplate according to claim 1, the method comprising:
   forming on a substrate, gate lines, data lines, power connection lines, and a plurality of sub-pixels defined by crossing of the gate lines and the data lines, wherein each sub-pixel comprises a driving circuit; the driving circuit comprises a plurality of transistors and a storage capacitor; the plurality of transistors comprise a switch transistor, a driving transistor and a sensing transistor, a first electrode of the storage capacitor is connected to a second electrode of the switch transistor and a gate electrode of the driving transistor respectively, and a second electrode of the storage capacitor is connected to a second electrode of the driving transistor and a second electrode of the sensing transistor respectively; for each sub-pixel, a first electrode of the driving transistor is connected to a power connection line; the power connecting line is arranged on a same layer as gate electrodes of the plurality of transistors;
   searching for a defective point formed by a short circuit of a gate line and a data line, wherein a gate line forming a defective point is a defective gate line, a data line forming a defective point is a defective data line, a first repair sub-pixel and a second repair sub-pixel are located at both sides of the defective data line respectively, and are connected to the defective data line, and a power connection line connected to the first repair sub-pixel and the second repair sub-pixel is a defective power connection line; and
   disconnecting the defective gate line from the defective power connection line, and forming a repair line in the first repair sub-pixel and second repair sub-pixel to repair the display baseplate, wherein the repair line is arranged at one side of source and drain electrodes of the plurality of transistors away from the substrate, the repair line is connected respectively to a partially disconnected defective gate line and a partially disconnected defective power connection line and is used for transmitting scanning signals to repair the display baseplate.

17. The method according to claim 16, wherein forming on the substrate, the gate lines, the data lines, the power connection lines, and the plurality of sub-pixels defined by the crossing of the gate lines and the data lines comprises:
   forming a light shielding layer and sensing connection lines on the substrate;
   forming a buffer layer on the light shielding layer and the sensing connection lines;
   forming active layers of the plurality of transistors and the first electrode of the storage capacitor on the buffer layer;
   forming a gate insulating layer on the active layers of the plurality of transistors and the first electrode of the storage capacitor;
   forming the gate lines, the gate electrodes of the plurality of transistors and the power connection lines on the gate insulating layer;
   forming an interlayer insulating layer on the gate lines, the gate electrodes of the plurality of transistors and the power connection lines; and
   forming the data lines, power lines, sensing lines and the source and drain electrodes of the plurality of transistors on the interlayer insulating layer.

18. The method according to claim 17, wherein disconnecting the defective gate line from the defective power connection line comprises:
   cutting the defective gate line into a first scanning portion, a second scanning portion and a third scanning portion disconnected from each other, along an arrangement direction of the gate lines using a laser process, wherein there is an overlap area between an orthogonal projection of the second scanning portion on the substrate and an orthogonal projection of the defective data line on the substrate, and the first scanning portion is connected to a gate electrode of a switch transistor in a sub-pixel located at one side of the defective data line close to the first repair sub-pixel; the third scanning portion is connected to a gate electrode of a switch transistor in a sub-pixel located at one side of the defective data line close to the second repair sub-pixel;

cutting the defective power connection line into a first connection portion, a second connection portion and a third connection portion disconnected from each other, along the arrangement direction of the gate lines using the laser process, wherein there is an overlap area between an orthogonal projection of the first connection portion on the substrate and the first electrode of the driving transistor in the first repair sub-pixel, and the first connection portion is connected to the first electrode of the driving transistor in the first repair sub-pixel; there is an overlap area between an orthogonal projection of the third connection portion on the substrate and the first electrode of the driving transistor in the second repair sub-pixel, and the third connection portion is connected to the first electrode of the driving transistor in the second repair sub-pixel; there is an overlap area between an orthogonal projection of the second connection portion on the substrate and second electrodes of switch transistors in the first repair sub-pixel and the second repair sub-pixel, and the second connection portion is connected to the repair line;

forming a first groove, a second groove, a first via hole and a second via hole in each of the first repair sub-pixel and the second repair sub-pixel using the laser process, wherein the first groove penetrates through the active layer of the switch transistor in the sub-pixel where the first groove is located, and an orthogonal projection of the first groove on the substrate is located between an orthogonal projection of the first electrode of the switch transistor in the sub-pixel where the first groove is located, on the substrate, and an orthogonal projection of the gate electrode of the switch transistor in the sub-pixel where the first groove is located, on the substrate; and the second groove penetrates through the second electrode of the switch transistor in the sub-pixel where the second groove is located, and an orthogonal projection of the second groove on the substrate is located between an orthogonal projection of the power connection line on the substrate and an orthogonal projection of the gate electrode of the driving transistor in the sub-pixel where the second groove is located, on the substrate; wherein the first via hole in the first repair sub-pixel is used for exposing the first scanning portion, the first via hole in the second repair sub-pixel is used for exposing the third scanning portion, and the second via holes are used for exposing the second connection portion.

19. The method according to claim 18, wherein forming the repair line in the first repair sub-pixel and the second repair sub-pixel to repair the display baseplate comprises:

depositing a metal film on the first sub-pixel and the second sub-pixel; and forming a first repair portion in the first sub-pixel and a second repair portion in the second sub-pixel through a patterning process to form the repair line;

wherein the first repair portion is connected to the first repair portion through the first via hole in the first repair sub-pixel, and the first repair portion is connected to the second connection portion through the second via hole in the first repair sub-pixel; the second repair portion is connected to the third scanning portion through the first via hole in the second repair sub-pixel, and the second repair portion is connected to the second connection portion through the second via hole in the second repair sub-pixel.

20. The method according to claim 19, further comprising:

forming the second electrode of the storage capacitor on the data lines, the power lines, the sensing lines and the source and drain electrodes of the plurality of transistors.

* * * * *